United States Patent
Ino et al.

(10) Patent No.: US 6,248,606 B1
(45) Date of Patent: *Jun. 19, 2001

(54) METHOD OF MANUFACTURING SEMICONDUCTOR CHIPS FOR DISPLAY

(75) Inventors: Masumitsu Ino; Hisao Hayashi; Masafumi Kunii; Takenobu Urazono; Shizuo Nishihara; Masahiro Minegishi, all of Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/219,137

(22) Filed: Dec. 22, 1998

Related U.S. Application Data

(63) Continuation of application No. 08/429,613, filed on Apr. 27, 1995, now Pat. No. 5,888,839.

(30) Foreign Application Priority Data

May 2, 1994 (JP) .................................................... 6-116007
Sep. 27, 1994 (JP) .................................................... 6-257616

(51) Int. Cl.[7] .................................................. H01L 21/20
(52) U.S. Cl. .......................... 438/30; 438/150; 438/151; 438/166; 438/487
(58) Field of Search ........................ 438/30, 166, 150, 438/487, 151

(56) References Cited

U.S. PATENT DOCUMENTS 4,584,025  4/1986  Takaoka et al. .
4,589,951  5/1986  Kawamura .
4,680,855  * 7/1987  Yamazaki et al. ...................... 29/583

(List continued on next page.)

FOREIGN PATENT DOCUMENTS 0 570 928 A1  11/1993  (EP) .
58-90723  5/1983  (JP) .
60-245124  12/1985  (JP) .
3-273621  12/1991  (JP) .
5-62 924  3/1993  (JP) .

(List continued on next page.)

OTHER PUBLICATIONS

Patent Abstracts of Japan, vol. 010, No. 367 (E–462), Dec. 9, 1986 & JP 61 163631 A (Ricoh Co Ltd), Jul. 24, 1986.
Patent Abstracts of Japan, vol. 017, No. 089 (E–1323), Feb. 22, 1993 & JP 04 282869 A (JII Tei Shii:KK), Oct. 7, 1992.

(List continued on next page.)

*Primary Examiner*—Vu A. Le
*Assistant Examiner*—Michael S. Lebentritt
(74) *Attorney, Agent, or Firm*—Sonnenschein, Nath & Rosenthal

(57) ABSTRACT

In a method of manufacturing semiconductor chips for display, a semiconductor thin film is first formed on an insulating substrate, and then a series of processes including a heat-treatment process for the semiconductor thin film are carried out to form integrated thin film transistors on a sectioned area for one chip. Thereafter, pixel electrodes for one picture (frame) are formed within the sectioned area. During the series of processes, a laser pulse is irradiated onto the sectioned area by one shot to perform a heat treatment on the semiconductor thin film for one chip collectively and simultaneously (i.e., perform a batch heat treatment on the semiconductor thin film). Through the batch heat treatment, the crystallization of the semiconductor thin film is promoted. In addition, after the semiconductor thin film is doped with impurities, the activation of impurities doped in the semiconductor thin film can be performed by the batch heat treatment.

14 Claims, 20 Drawing Sheets

U.S. PATENT DOCUMENTS

| | | | |
|---|---|---|---|
| 4,713,518 | * 12/1987 | Yamazaki et al. | 219/121 |
| 4,874,920 | * 10/1989 | Yamazaki et al. | 427/53.1 |
| 4,970,368 | * 11/1990 | Yamzaki et al. | 219/121 |
| 5,413,958 | 5/1995 | Imahashi et al. . | |
| 5,432,122 | 7/1995 | Chae . | |
| 5,471,330 | 11/1995 | Sarma . | |
| 5,523,257 | 6/1996 | Yamazaki et al. . | |
| 5,529,951 | 6/1996 | Noguchi et al. . | |
| 5,888,839 | * 3/1999 | Ino et al. | 438/30 |

FOREIGN PATENT DOCUMENTS

| | | |
|---|---|---|
| 5-66 422 | 3/1993 | (JP) . |
| 5-66422 | 3/1993 | (JP) . |
| 5-129 332 | 5/1993 | (JP) . |

OTHER PUBLICATIONS

Patent Abstracts of Japan, vol. 17, No. 375 (E–1397)(6004), Jul. 14, 1993, JP 5–62 924 A (Sony).

Patent Abstracts of Japan, vol. 17, No. 387 (P–1576)(6016), Jul. 20, 1993, JP 5–66 422 A (Sony).

Patent Abstracts of Japan, vol. 17, No. 501 (E–1429)(6130), Sep. 9, 1993, JP 5–129 332 A (Fujitsu).

* cited by examiner

HEAT OR COOL

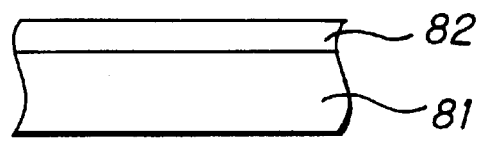
FIG. 12A
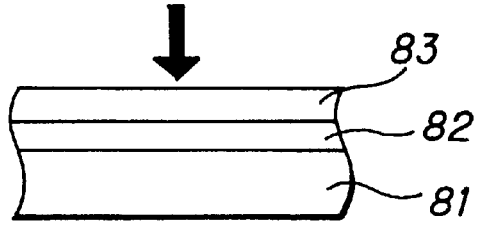
FIG. 12B
FIG. 13
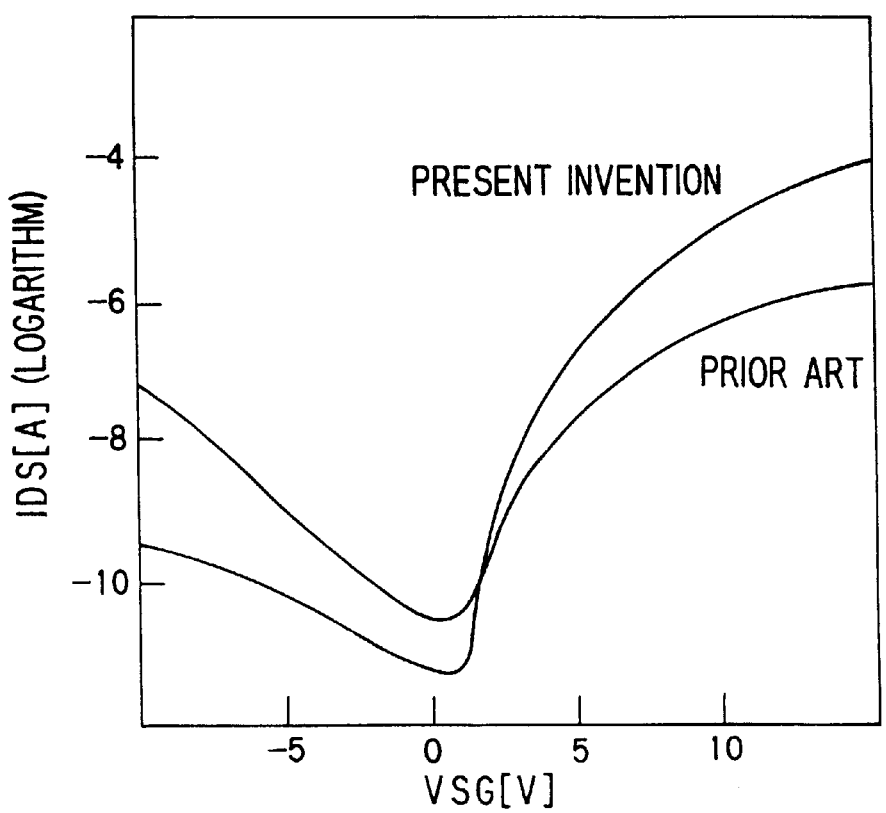

METHOD OF MANUFACTURING SEMICONDUCTOR CHIPS FOR DISPLAY

CROSS-REFERENCE TO RELATED APPLICATION

This Application is a Continuation of prior application Ser. No. 08/429,613, filed Apr. 27, 1995 now U.S. Pat. No. 5,888,839.

BACKGROUND OF THE INVENTION

1. Field of the Invention

The present invention relates to a method of manufacturing semiconductor chips for display, and more particularly to a method of thermally treating a semiconductor thin film with laser irradiation.

2. Description of Related Art

Liquid crystal display devices which are designed in a large size and with high minuteness and in which polycrystal silicon thin film transistors are used as switching elements have been developed with much hope. In order to mass-produce liquid crystal displays with polycrystal silicon thin film transistors in a large size and with high minuteness, it is indispensable to establish a low-temperature process in which low-price glass substrates are usable. A technique that a laser beam is irradiated onto a semiconductor thin film of amorphous silicon or the like to form high-quality polycrystal silicon on a glass substrate having a low melting point has been greatly expected as a method to perform the low-temperature process.

FIG. 1 is a schematic diagram showing a previous paper suggested laser beam irradiation method. A semiconductor chip 101 for display which is a target to be processed has such a laminating structure that a semiconductor thin film 103 is formed on a transparent insulating substrate 102. In this method, a laser beam 105 is irradiated onto a predetermined sectioned area 104 which is provided on the semiconductor thin film 103. In the conventional method, the output power of the laser beam is limited to a small level, and thus the maximum area which can be irradiated with one-shot laser irradiation of laser is limited to a narrow area about 100 $\mu m^2$. Accordingly, when a semiconductor thin film 103 having a large area is required to be processed to satisfy a requirement for a large-scale picture, the laser beam is irradiated onto the whole semiconductor thin film while scanning the laser beam 105 or shifting the laser-irradiation area stepwisely. That is, it has been hitherto considered important to increase the energy density of the laser beam rather than to narrow the laser-irradiation area down. With increase of the energy density, a semiconductor thin film of amorphous silicon or polycrystal silicon having relatively small grain size is perfectly melted to increase its grain size. In this method, however, an irradiation time per chip increases and thus manufacturing throughput is reduced. Furthermore, the scanning of the irradiation of the laser beam causes temperature difference to occur locally, and thus causes increase in variability of crystal grain size. Therefore, wide variations occur in electrical characteristics of the thin film transistors such as mobility, a threshold voltage, etc.

The above point will be described in detail with reference to FIG. 2.

In the method as described above, the semiconductor thin film 103 having a large area is crystallized by irradiating a laser beam onto a small area while scanning the laser beam as shown in FIG. 2. Accordingly, non-uniformity of crystallization occurs at an overlap area 106 between a laser shot and a next laser shot, so that the electrical characteristics of thin film transistors formed at the overlap area 106 are uneven. For example, the overlap area 106 is subjected to the laser irradiation several times, whereas the other areas are subjected to the laser irradiation only once, so that the heating temperature for the semiconductor thin film is also locally uneven.

In addition to the method as described above, various laser irradiation systems have been hitherto proposed. For example, in a method of manufacturing a semiconductor device as disclosed in Japanese Laid-open Patent Application No. Sho-60-245124, a laser pulse having wavelength of 150 nm to 350 nm is irradiated at an energy density of 200 to 500 mJ/cm$^2$ to promote crystallization of a semiconductor thin film. In this system, an amorphous area and a crystal area coexist on a substrate, and thin film transistors are integrated over the two areas. Accordingly, the electrical characteristics of the thin film transistors vary between both the amorphous area and the crystal area, and thus controllability is lost.

Furthermore, in a method of manufacturing a semiconductor memory as disclosed in Japanese Laid-open Patent Application No. Hei-3-273621, a laser annealing treatment is performed on a memory-cell basis (microarea in several tens $\mu m$ order), and non-irradiated areas remain in between memory cells. Therefore, it is impossible to irradiate a laser beam onto a large-scale circuit at the same time.

Still furthermore, in a method of manufacturing a liquid crystal display device as disclosed in Japanese Laid-open Patent Application No. Hei-5-66422, for crystallization of a semiconductor thin film, a one (single) shot of laser pulse is irradiated onto each of areas on which a horizontal scanning circuit and a vertical scanning circuit respectively will be formed. In this case, it is necessary to make crystallized areas continuous, and thus the crystal particle size is dispersed at a linking boundary between the laser-irradiated areas.

SUMMARY OF THE INVENTION

An object of the present invention is to provide a method of manufacturing semiconductor chips for display in which semiconductor thin films having a large size can be mass-produced to have uniform particle size with shortening a heat-treatment time.

In order to attain the above object, a method of manufacturing semiconductor chips for display comprises a step of forming a semiconductor thin film on an insulating substrate, a step of processing the semiconductor thin film to form an integrated thin film transistors in a sectioned area for one chip and a step of forming pixel electrodes in the sectioned area to form a picture (frame), wherein the processing step contains a step of irradiating a laser pulse to the sectioned area by a single shot exposure to perform a batch heat-treatment on the semiconductor thin layer for one chip. At the laser-irradiation step, the semiconductor thin film is crystallized with the batch heat-treatment, or the semiconductor thin film is doped with impurities and then the impurities are activated with the batch heat-treatment. If necessary, the laser-irradiation step as described above may be performed after the semiconductor thin film is doped with the impurities, whereby the crystallization of the semiconductor thin film and the activation of the impurities are performed at the same time.

In the laser-irradiation step, a one-shot laser pulse may be successively irradiated onto each of plural sectioned areas which are beforehand provided on an insulating substrate. In this case, a one-shot laser pulse is irradiated onto an individual sectioned area except for a separation band which is provided between neighboring sectioned areas. When the individual sectioned area is rectangular, a laser pulse having a rectangular section which conforms to the shape of the sectioned area may be irradiated by one shot.

As a condition for laser irradiation, a one-shot laser pulse may be irradiated for a pulse time which is set to 40 nanoseconds or more. In this case, the batch heat-treatment can be performed to control crystallization of the semiconductor thin film in a state where the temperature of the insulating substrate is increased to the room temperature or more, or decreased to the room temperature or less. Furthermore, if the semiconductor thin film is beforehand formed at a thickness which is smaller than the absorption depth of the laser pulse, the crystallization or activation can be perfectly performed.

If necessary, a one-shot laser pulse may be irradiated through a microlens array to selectively concentrate the laser pulse on a portion of the semiconductor thin film, which corresponds to the element area of an individual thin film transistor. Furthermore, the one-shot laser pulse irradiation may be performed while controlling the cross-section intensity distribution of the laser pulse so that the irradiation energy density increases from the central portion of a sectioned area toward the peripheral portion thereof.

Furthermore, if necessary, the laser pulse may be irradiated in an oblique direction onto the insulating substrate. Specifically, at this oblique laser irradiation step, the laser pulse is irradiated within an incident angle range of 30 to 60° to the normal direction of the insulating substrate. For example, the oblique laser irradiation step is used to crystallize a semiconductor thin film formed of amorphous silicon with the batch heat-treatment. In this case, the batch heat-treatment is performed while the insulating substrate is kept in a temperature range of 550° C. to 650° C., thereby promoting crystallization of amorphous silicon.

According to the present invention, a one-shot laser pulse is irradiated onto a sectioned area to perform the batch heat-treatment on a semiconductor thin film for one chip. With this operation, the processing time for the laser irradiation step can be shortened, and the mass-production can be performed. The laser irradiation step is used to promote crystallization of the semiconductor thin film with the batch heat-treatment. The batch heat-treatment provides crystals having excellent uniformity, so that the process condition can be stabilized and uniformity in electric characteristics of the thin film transistors can be kept. The laser irradiation step as described above is effectively usable not only for the crystallization of a semiconductor thin film, but also for the activation of impurities which is performed with a batch heat-treatment after a semiconductor thin film is doped with the impurities. When the laser pulse is irradiated onto the semiconductor thin film, its energy is absorbed on only the surface of the semiconductor thin film, and then heat is thermally conducted into the inner portion of the semiconductor thin film, so that the inner portion of the semiconductor thin film is melted to be recrystallized or annealed to increase the crystal grain size. Furthermore, the impurities doped into the semiconductor thin film are activated. As described above, the laser pulse irradiation enables crystallization of the semiconductor thin film, the activation of the impurities, etc. at a low temperature without increasing the temperature of the substrate.

According to the laser irradiation step of the present invention, the one-shot laser pulse irradiation is performed for a pulse time which is set to 40 nanoseconds or more. By setting a one-shot irradiation time of the laser pulse to a sufficient one, the semiconductor thin film can be melted and crystallized by only one-shot laser pulse, so that it is expected to improve the uniformity of the crystal grain size and the throughput. Furthermore, in the laser irradiation step, the semiconductor thin film can be subjected to the batch heat-treatment in the state where the insulating substrate is beforehand increased to the room temperature or more or decreased to the room temperature or less. Therefore, a cooling speed of the semiconductor thin film which is once melted by the laser irradiation can be controlled, so that the crystal grain size, the activation degree of the impurities, etc. can be adjusted to the optimum values. Furthermore, by forming the semiconductor thin film at a thickness which is smaller than the absorption depth of the laser pulse, the semiconductor thin film can be perfectly melted, and it can be promoted to obtain crystals having a large particle size.

According to another aspect of the present invention, the one-shot radiation of the laser pulse is performed through the microlens array to selectively concentrate the laser pulse on a portion of the semiconductor thin film which is to be an element area of an individual thin film transistor. Accordingly, the energy contained in the one-shot laser pulse can be efficiently used.

According to another aspect of the present invention, the one-shot laser pulse irradiation is performed while the cross-sectional intensity distribution of the laser pulse is controlled so that the irradiation energy density is more increases from the central portion of the sectioned area to the peripheral portion thereof. In a laser anneal treatment for a relative-large area, thermal diffusion occurs from the peripheral portion of an irradiated area, so that the cooling speed of the peripheral portion is higher than that of the central portion. In order to compensate for this (i.e., the difference in cooling speed between the central and peripheral portions), the cross-sectional intensity distribution of the laser pulse is beforehand set so as to be increased toward the peripheral portion to thereby make the cooling speed uniform over the sectioned area.

According to another aspect of the present invention, the oblique laser irradiation step of irradiating the laser pulse onto the insulating substrate in an oblique direction is adopted. For example, by irradiating the laser pulse within an incident angle range of 30° to 60° to the normal direction of the insulating substrate, the batch heat-treatment can be performed on a broader area than a vertical laser irradiation step. That is, when the oblique laser irradiation is performed, the irradiation area is larger than the cross section of the laser pulse, and thus a broader area can be subjected to the batch heat-treatment with a one-shot laser pulse. However, the irradiation energy density per unit area is smaller in the oblique laser irradiation than that in the vertical laser irradiation. In order to compensate for this, the oblique laser irradiation may be performed in a state where the insulating substrate is kept at a high temperature. For example, when a semiconductor thin film of amorphous silicon is crystallized, the oblique laser irradiation is preferably performed in a state where the insulating substrate is heated within a temperature range of 550° C. to 650° C. If the laser pulse is irradiated within an incident angle of 60° to the normal direction, the irradiation area would be increased to be twice as large as that in the vertical laser irradiation, however, the energy density would be reduced to half.

BRIEF DESCRIPTION OF THE DRAWINGS

FIGS. 12A and 12B are schematic diagrams showing a series of processes for another embodiment of the semiconductor chip manufacturing method according to the present invention;

FIG. 13 is a graph showing electrical characteristics of thin film transistors which are formed by the present invention and the conventional method;

DETAILED DESCRIPTION OF THE PREFERRED EMBODIMENTS

Preferred embodiments according to the present invention will be described hereunder with reference to the accompanying drawings.

Figure 1:
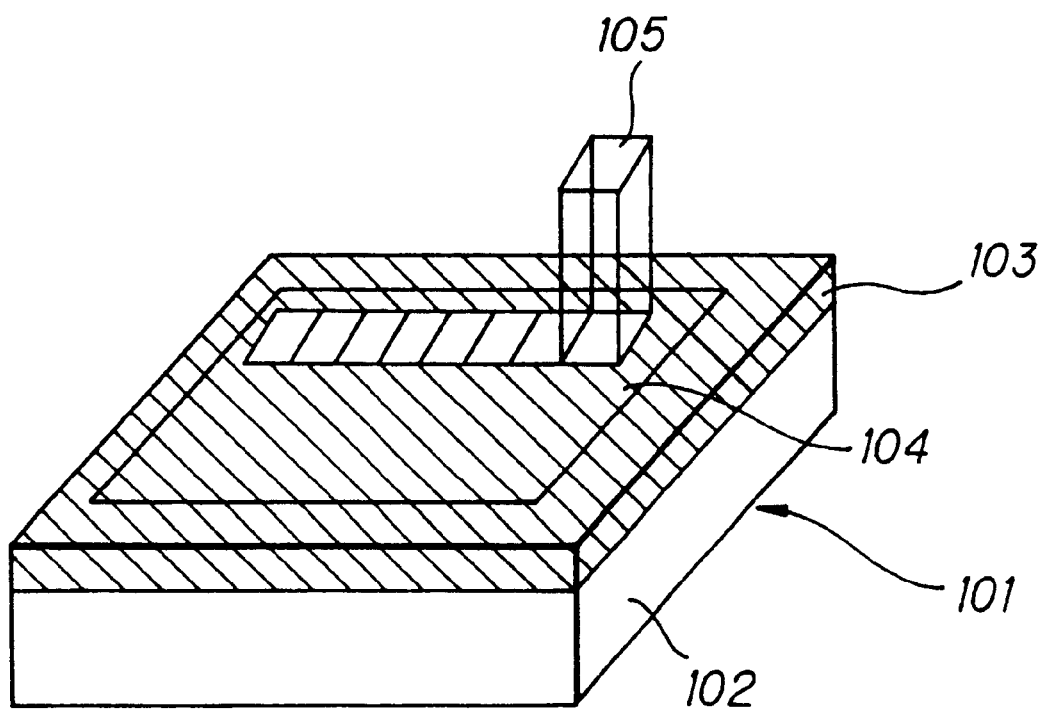
FIG. 1 is a schematic diagram showing a laser irradiation process.
Figure 2:
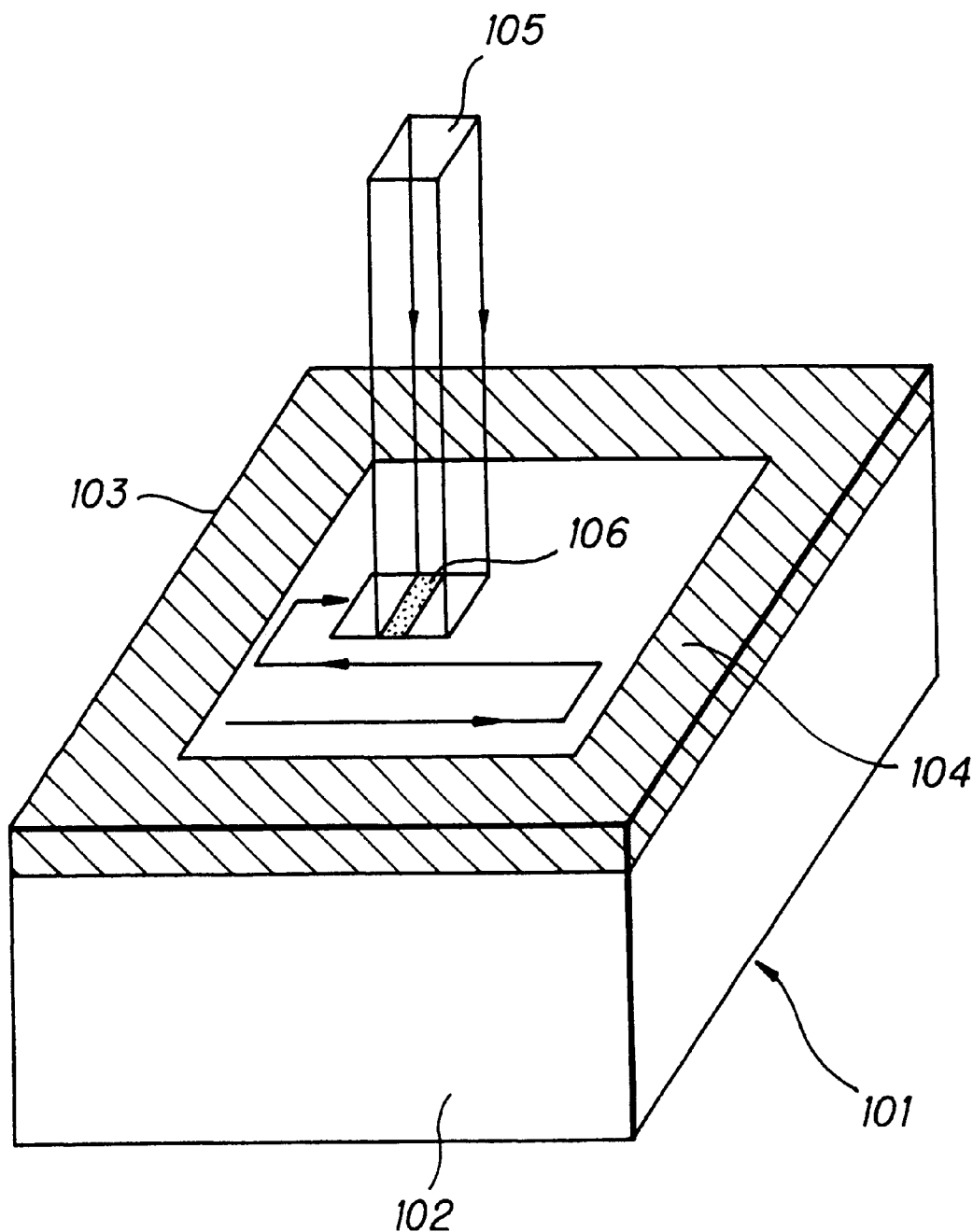
FIG. 2 is another schematic diagram showing the laser irradiation process.
Figure 3:
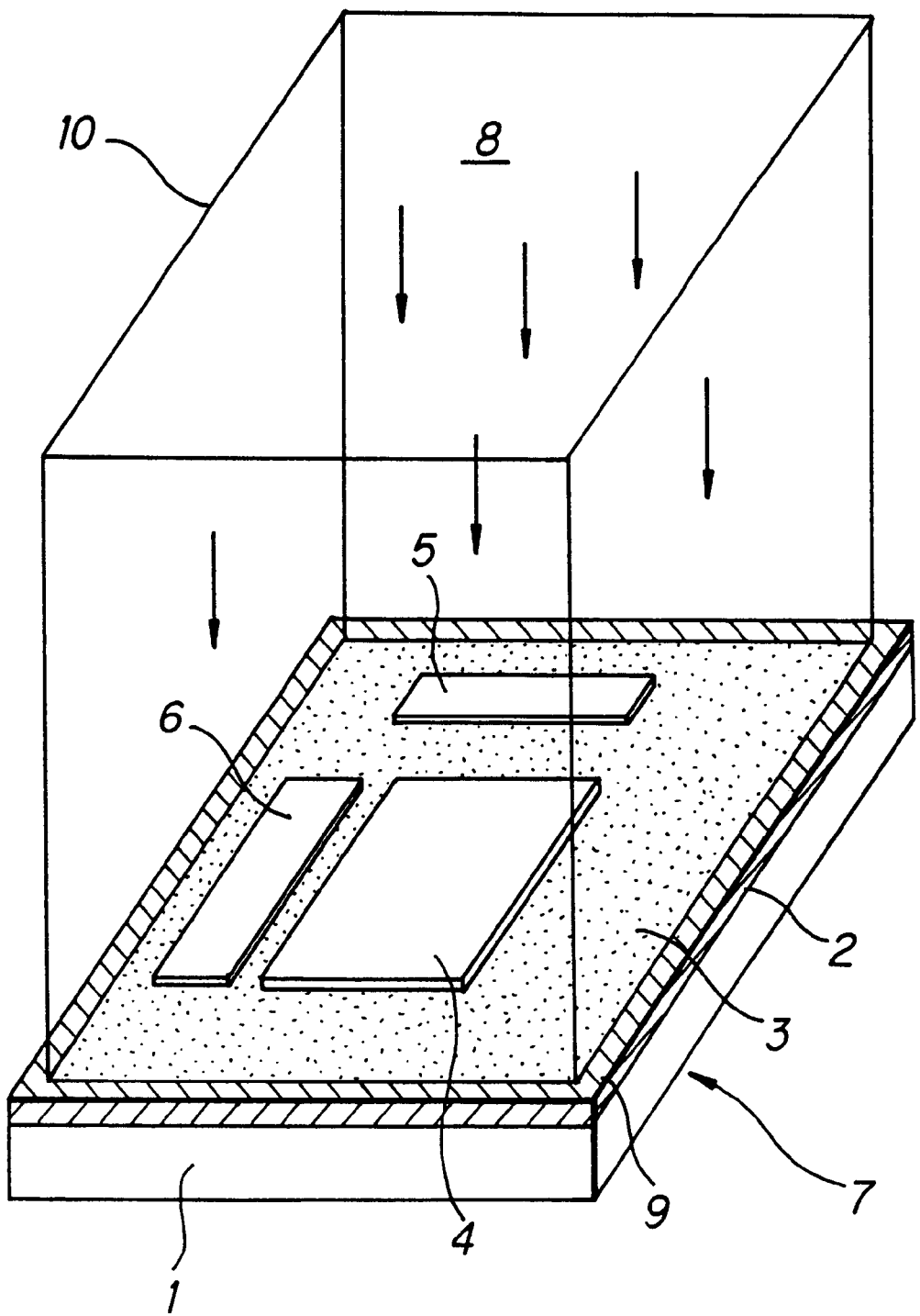
FIG. 3 is a schematic diagram showing an embodiment of a method of manufacturing a semiconductor chip for display.

FIG. 3 is a schematic diagram showing a basic process for a method of manufacturing a semiconductor chip for display (e.g., display panel). In the semiconductor chip manufacturing method, a film forming process is first performed to form a semiconductor thin film 2 on a transparent insulating substrate 1 which is formed of glass material having relatively low melting point (below 600° C., for example). The semiconductor thin film 2 is formed of amorphous or polycrystal having relatively small grain size before processed, for example, it is formed of amorphous silicon or polycrystal silicon. The semiconductor thin film 2 is subjected to a series of processes containing a heat treatment process to form integrated thin film transistors on a sectioned area 3 for one chip. In this embodiment, the sectioned area 3 contains a matrix array (containing thin film transistors and electrodes for pixels) 4, a horizontal scanning circuit 5 and a vertical scanning circuit 6. Integrated thin film transistors are formed on each of the above elements. Finally, pixel electrodes for one panel are formed on the matrix array 4 to complete a semiconductor chip 7 for a display panel.

According to the present invention, the series of processes as described above contain a laser irradiation process of irradiating a laser pulse 8 on the sectioned area 3 by a one shot exposure to perform the batch heat-treatment on the semiconductor thin film 2 for one chip. The laser irradiation process is used to crystallize the semiconductor thin film 2 by the batch heat-treatment. For example, when the semiconductor thin film 2 is formed of amorphous silicon in its precursive state (i.e., before it is processed), the semiconductor thin film 2 is temporarily melted by the batch heat-treatment, and then crystallized to obtain polycrystal silicon having relatively large grain size. On the other hand, when the semiconductor thin film 2 is formed of polycrystal having a relatively small grain size in its precursive state, the semiconductor thin film 2 is temporarily melted by the batch heat-treatment, and then crystallized to obtain polycrystal silicon having a relatively large grain size. The laser irradiation process is not limited to crystallization, and it may be applied to a case where the semiconductor thin film 2 is doped with impurities and then the impurities are activated by the batch heat-treatment. Furthermore, the crystallization of the semiconductor thin film 2 and the activation of the impurities can be simultaneously performed by the batch heat-treatment.

An excimer laser beam source may be used to emit the laser pulse 8. Since the excimer laser beam is a strong pulse ultraviolet ray, it is absorbed on the surface layer of the semiconductor thin film 2 of silicon or the like to increase the temperature of the surface layer, however, it does not heat the insulating substrate 1. As a precursive film to be formed on the insulating substrate 1 may be selected a plasma CVD silicon film or the like which can be formed at a low temperature. For example, when a plasma CVD silicon film is formed at a thickness of 30 nm on a transparent insulating substrate 1 of glass material, the melting threshold energy when an XeCl excimer laser beam is irradiated is about 130 mJ/cm$^2$. Energy of about 220 mJ/cm$^2$ is required to melt the whole film, and it takes about 70 ns from the time when it is melted until the time when it is solidified.

The insulating substrate 1 is generally formed of a large-size wafer from which many semiconductor chips 7 for display are taken out. That is, plural sectioned areas 3 are set on the insulating substrate 1 in advance, and the laser pulse 8 is successively irradiated onto each sectioned area by a single shot exposure in the laser irradiation process. In this case, the laser pulse 8 is irradiated onto each sectioned area 3 by one shot except for a separation band which is provided between neighboring sectioned areas 3. In this embodiment, each sectioned area 3 has a rectangular shape, and thus the laser pulse 8 having a rectangular section 10 which conforms to the shape of the sectioned area 3 is irradiated by one shot.

As an irradiation condition, the one-shot irradiation of the laser pulse 8 is performed for a pulse time which is set to 40 nanoseconds or more, for example. At this time, the batch heat-treatment is performed in a state where the insulating substrate 1 is increased to the room temperature or more or decreased to the room temperature or less, thereby controlling the crystallization of the semiconductor thin film 2. Furthermore, the semiconductor thin film 2 is formed at a thickness which is smaller than the absorption depth of the laser pulse 8, thereby enabling the semiconductor thin film 2 to be perfectly melted.

If necessary, the one-shot irradiation of the laser pulse 8 may be performed through a microlens array to selectively concentrate the irradiation of the laser pulse on a portion of the semiconductor thin film 2 which is an element area for each thin film transistor, whereby the laser energy can be efficiently used. Furthermore, the cross-sectional intensity distribution of the laser pulse 8 may be controlled for the one-shot irradiation so that the irradiation energy density increases from the central portion of each sectioned area 3 toward the peripheral portion thereof, whereby the temperature gradient of heat radiation through the insulating substrate 1 is made uniform. Still furthermore, the laser pulse 8 is irradiated from the vertical direction onto the insulating substrate 1 in FIG. 3, however, it may be irradiated from an oblique direction to the insulating substrate 1 to perform the heat treatment. With this irradiation, the sectioned area 3 can be set to a value which is larger than the cross-sectional area 10 of the laser pulse 8.

As described above, the present invention is characterized in that the large-area semiconductor chip 7 for display is annealed at a time. In this embodiment, the laser pulse 8 is irradiated over the semiconductor thin film 2 formed of amorphous silicon or polycrystal silicon having relatively minute grain size at a time. Each sectioned area 3 serves as an irradiation area, and each separation band 9 serves as a non-irradiation area. The sectioned area 3 serving as the laser irradiation area is provided with a matrix array 4, a horizontal scanning circuit 5 and a vertical scanning circuit 6. Any of these elements contains thin film transistors. In the semiconductor chip 7 for display as described above, the total number of thin film transistors exceeds 100 kbits, and the diagonal dimension of the sectioned area 3 is above 14 mm. The maximum diagonal dimension extends to about 3 inches. The excimer laser beam of 300 nm to 350 nm in wavelength is irradiated to the sectioned area 3, and the energy density thereof is set to about 200 mJ/cm$^2$ to 400 mJ/cm$^2$. No thin film transistor is formed at the separation band 9 serving as the non-irradiation area and it is used as a scribe area for the semiconductor chip 7 for display. As a result, the laser irradiation area and the laser non-irradiation area coexist on the semiconductor chip 7 for display.

Figure 4:
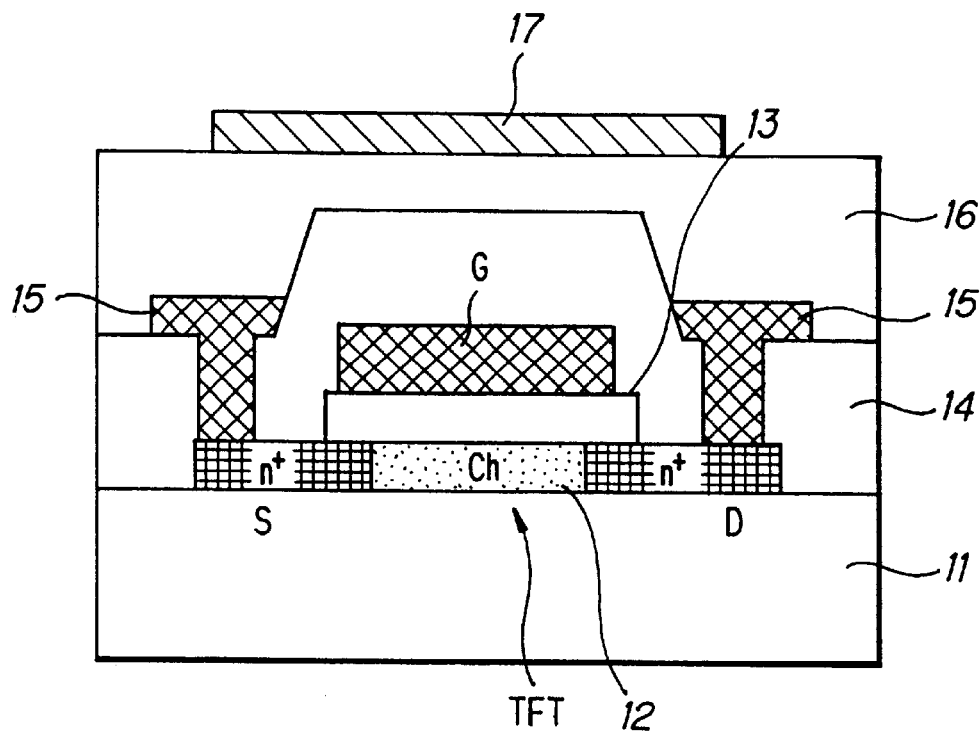
FIG. 4 is a cross-sectional view showing an example of the construction of a thin film transistor contained in a semiconductor chip for display which is manufactured according to the present invention.

FIG. 4 is a cross-sectional view showing an example of integrated thin film transistors (TFT) which are formed on the semiconductor chip 7 for display shown in FIG. 3. In this embodiment, a planar type thin film transistor is formed. As shown in FIG. 4, a semiconductor thin film 12 constituting an element area of TFT is formed on the transparent insulating substrate 11. The semiconductor thin film 12 is formed of silicon which is crystallized by the one-shot irradiation of the laser pulse as described above. A gate electrode G which is formed of alloy of aluminum and silicon or the like is patterned through a gate insulating film 13 on the semiconductor thin film 12. Both portions of the semiconductor thin film 12 at both sides of the gate electrode G are doped with n-type impurities of high concentration to form a source region S and a drain region D of the TFT. A channel region Ch is also provided between the source region S and the drain region D. The impurities which are doped at a high concentration by an ion implantation method or the like are activated by the one-shot irradiation of the laser pulse. The TFT thus constructed is covered with a first layer insulating film 14 formed of PSG or the like. A wiring 15 formed of metal aluminum or the like is formed on the first layer insulating film 14 by a patterning treatment, and it is conducted to the source region S and the drain region D through contact holes. With respect to the thin film transistors formed on the matrix array 4 shown in FIG. 3, in place of the wiring 15, a pixel electrode is connected to the drain region D. The wiring 15 is further covered with a second layer insulting film 16 formed of PSG or the like, and a passivation film 17 formed of P—SiN or the like is formed on the second layer insulating film 16.

Figure 5:
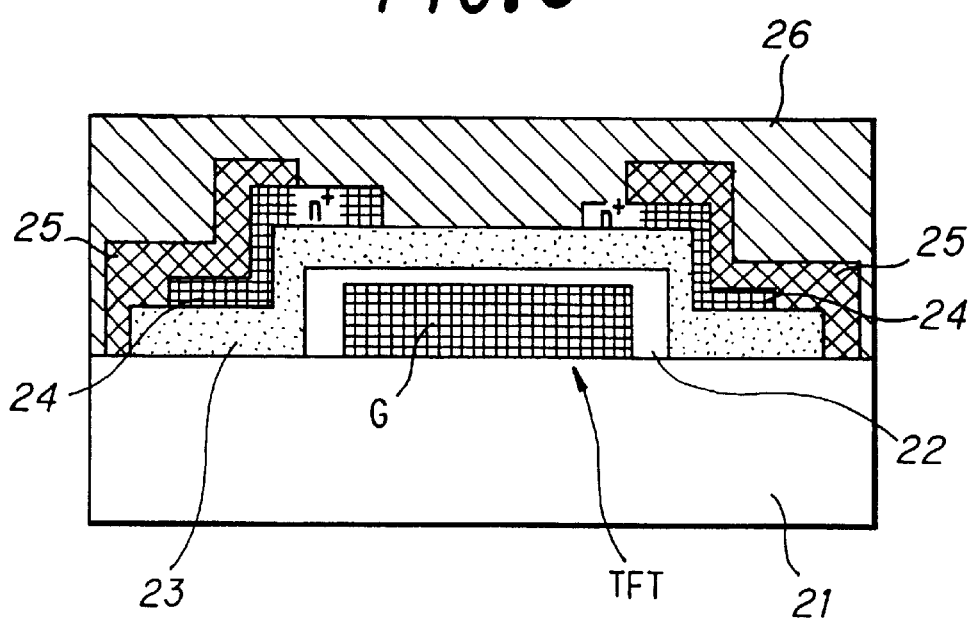
FIG. 5 is a cross-sectional view showing another example of the construction of a thin film transistor.

FIG. 5 is a cross-sectional view showing another example of the thin film transistor formed on the semiconductor chip for display shown in FIG. 3. The TFT of this embodiment is of a reverse-staggered type, and a gate electrode G formed of alloy of aluminum and silicon or the like is formed on a transparent insulating substrate 21 by the patterning treatment. Furthermore, a semiconductor thin film 23 is formed on the gate electrode G through a gate insulating film 22. The semiconductor thin film 23 is formed of silicon or the like which is crystallized by the one-shot irradiation of the laser pulse as described above. A wiring 25 formed of aluminum or the like is formed at both sides of the gate electrode G on the semiconductor thin film 23 through an impurity-diffusion layer 24. The TFT thus constructed is covered with a passivation film 26 formed of P—SiN or the like.

The following Table 1 shows a concrete irradiation condition for the laser irradiation method of the present invention, and an irradiation condition for the previously suggested irradiation method is also shown in the table for comparison.

TABLE 1

|  | COMPARATIVE METHOD | PRESENT INVENTION |
|---|---|---|
| CRYSTAL GRAIN SIZE | 20 nm–150 nm | 100 nm–150 nm |
| LASER TREATMENT TIME (IRRADIATION TIME + SCANNING TIME) | 25 × (150 nsec + 100 msec) = 2.5 sec LASER IRRADIATION AT 25 TIMES | 150 nsec SINGLE LASER IRRADIATION |
| LASER IRRADIATION | 1 cm × 1 cm | 5 cm × 5 cm |

In an example of the Table 1, the one-shot irradiation of the laser beam was performed on a section area of 5 cm×5 cm. At this time, the energy density was set to 200 mJ/cm$^2$ to 450 mJ/cm$^2$. In the comparative method, the laser pulse irradiation on a sectioned area of 5 cm×5 cm must be divided into 25 laser pulse irradiation shots. That is, the laser irradiation area per laser pulse shot is limited to an area of 1 cm×1 cm, and thus the one-shot laser pulse irradiation must be performed totally 25 times to irradiate the whole sectioned area of 5 cm×5 cm. The laser processing time per one chip is equal to the sum of an irradiation time and a scanning time. In the present invention, the scanning time is equal to zero because the one-shot irradiation is adopted, and thus the laser processing time is equal to 150 nsec. On the other hand, in the prior art, the irradiation time per one-shot is equal to 150 nsec, and the scanning time is equal to 100 msec. Therefore, when the laser irradiation is carried out 25 times, the total processing time is equal to 2.5 seconds. Accordingly, the throughput is more remarkably improved in the present invention than in the prior art. The grain size of the semiconductor thin film which was processed according to the method of the present invention was equal to 100 nm to 150 nm. The grain size was measured with a transmission-type electron microscope (TEM). The grain size of the semiconductor thin film which was processed according to the comparative method was equal to 20 nm to 150 nm. As is apparent from this result, the variations of the grain size could be reduced by the one-shot irradiation of the laser pulse.

Figure 6:
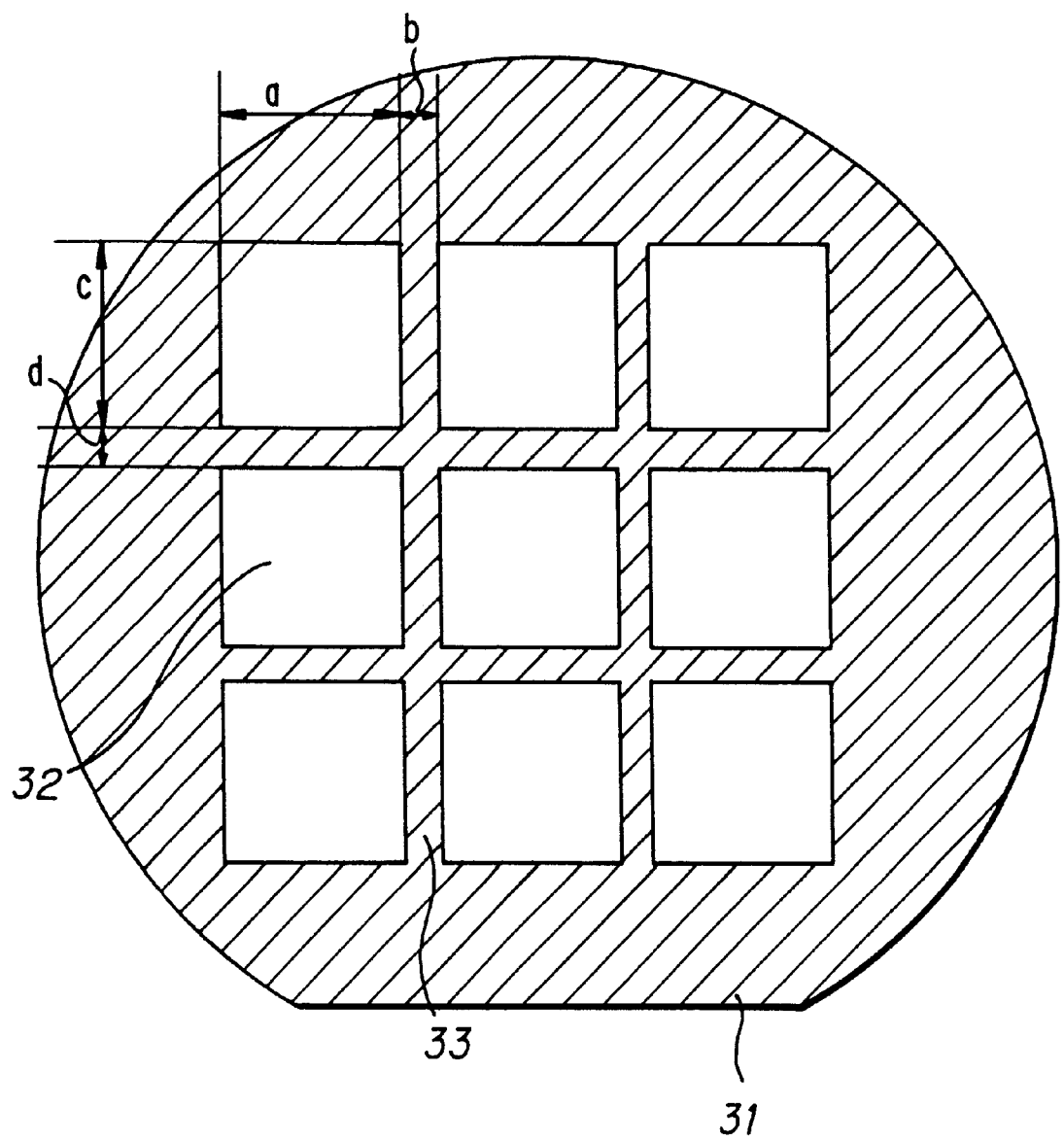
FIG. 6 is a plan view showing a multi-chip wafer which is subjected to a laser irradiation process of the present invention.

FIG. 6 schematically shows a multi-chip wafer to which the laser irradiation method of the present invention is applied. In this embodiment, the laser pulse is successively irradiated by one shot onto each of plural sectioned areas 32 which are beforehand provided on a transparent insulating substrate (wafer) of 5 inches in diameter, thereby obtaining totally nine semiconductor chips for display. In the present invention, the one-shot irradiation of the laser pulse is carried out on each sectioned area 32 except for a separation band 33 which are provided between the neighboring sectioned areas 32. As shown in FIG. 6, the size of each sectioned area is set to a in lateral length and b in longitudinal length. The size of the separation band is set to b in longitudinal width and d in lateral width. In this embodiment, a is set to be larger than b, and c is set to be larger than d. The longitudinal and lateral separation bands are used as scribe lines at a subsequent process.

Next, the method of manufacturing semiconductor chips for display according to this embodiment will be described in more detail with reference to FIGS. 7A to 7O.

Figure 7A:
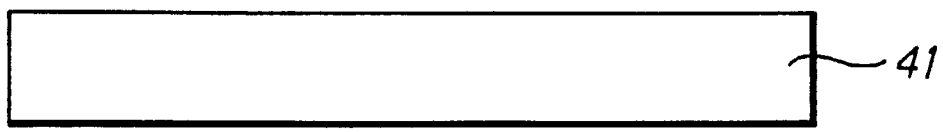
FIGS. 7A to 7O are diagrams showing a series of processes for the method of manufacturing a semiconductor chip for display according to the present invention.
Figure 7B:
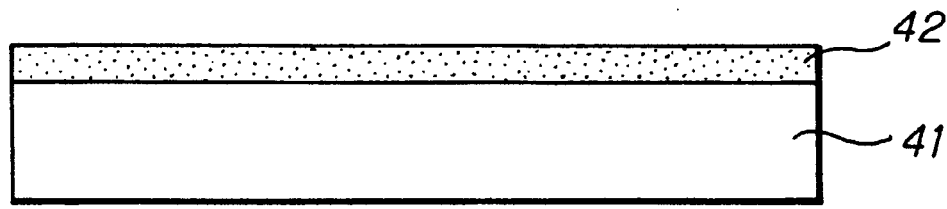
Figure 7C:
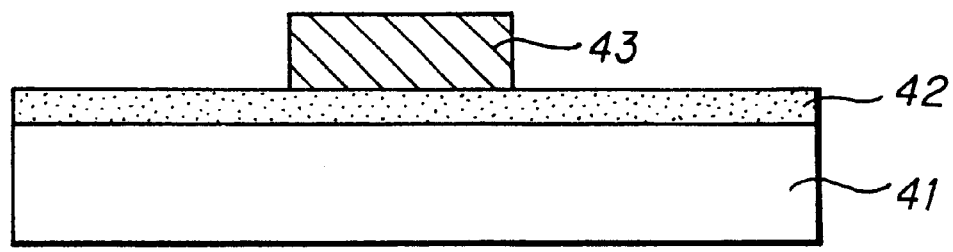
Figure 7D:
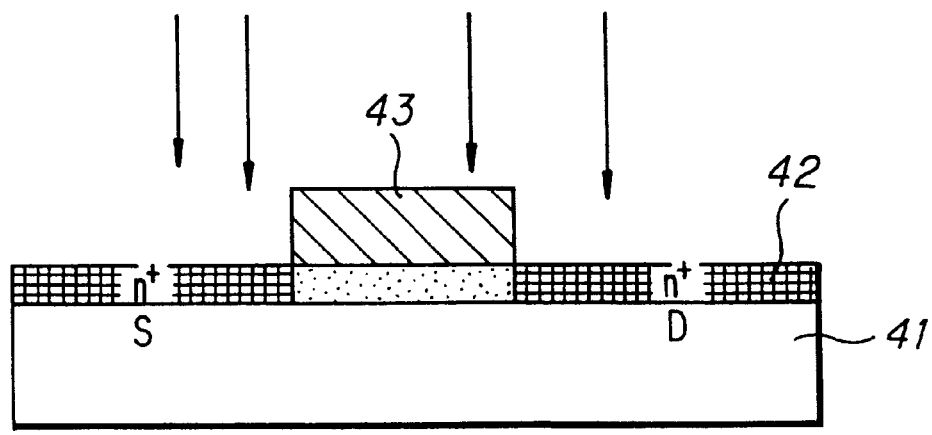

First, a transparent insulating substrate 41 is provided in a process of FIG. 7A. Subsequently, an amorphous silicon film 42 is formed on the transparent insulating substrate 41 by LPCVD method in a process of FIG. 7B. Thereafter, a resist 43 is patterned on the amorphous silicon film 42 upon the shape of a gate electrode in a process of FIG. 7C, and then n-type impurities are doped through the resist by an ion implantation method to form a source region S and a drain region D in a process of FIG. 7D.

Figure 7E:
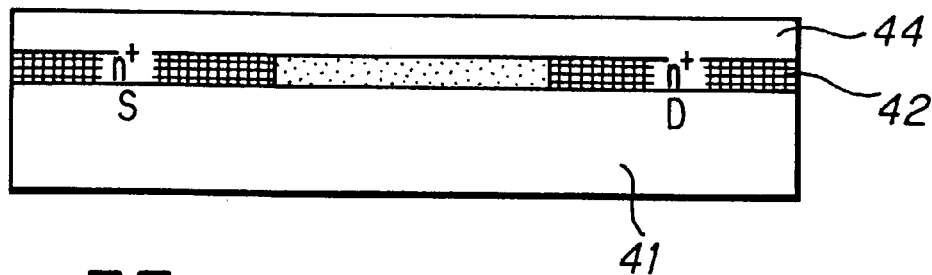
Figure 7F:
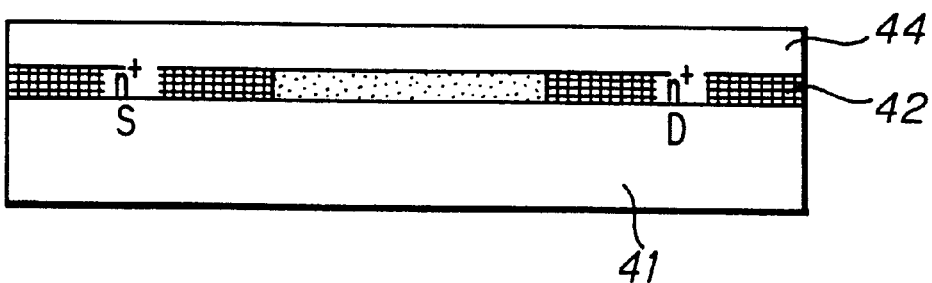
Figure 7G:
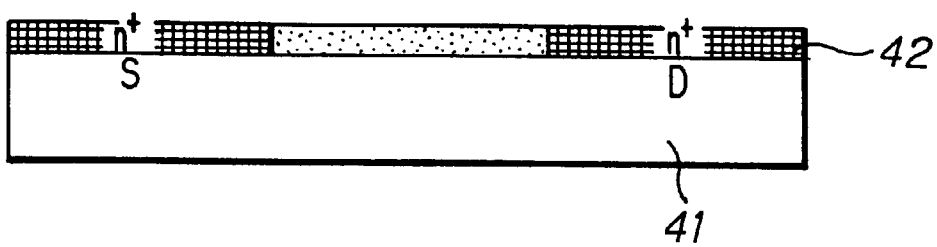
Figure 7H:
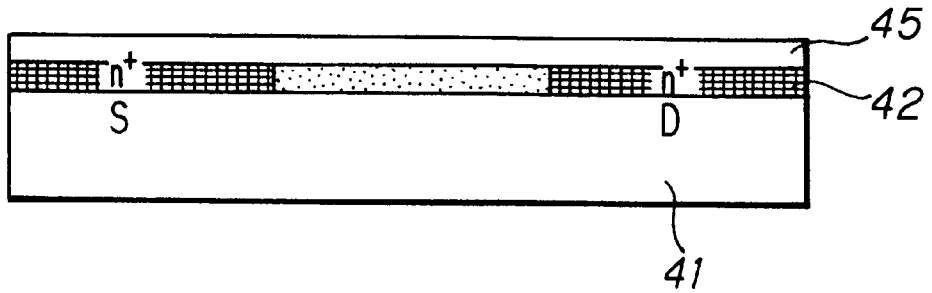

Subsequently, a nonreflective coating 44 is formed on the amorphous silicon film 42 in a process of FIG. 7E. The nonreflective coating is formed of $SiO_2$, SiN, SiON or the like. In a next process of FIG. 7F, the one-shot irradiation of the laser pulse is conducted to crystallize the amorphous silicon film 42 and activate the impurities doped in the source region S and the drain region D. At this time, the nonreflective coating 44 has an effect of improving the absorption efficiency of the irradiation energy of the laser pulse. After the laser irradiation process of FIG. 7F, the used nonreflective coating is removed by an etching treatment in a process of FIG. 7G so that only the crystallized silicon film 42 remains. Subsequently, in a process of FIG. 7H, a patterning is conducted with a photoresist, and an undesired portion of the silicon film 42 is removed by a dry etching treatment. Thereafter, a $SiO_7$ film is formed by a pressure-reduced CVD to form a gate insulating film 45.

Figure 7I:
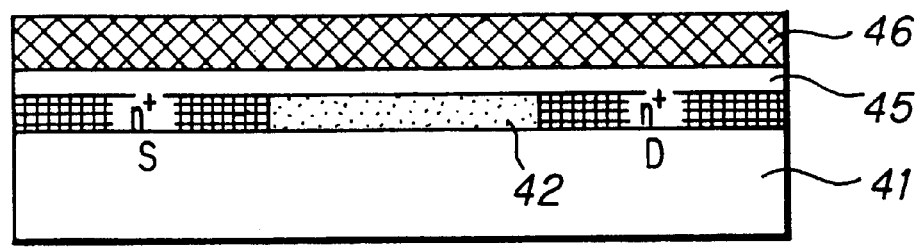
Figure 7J:
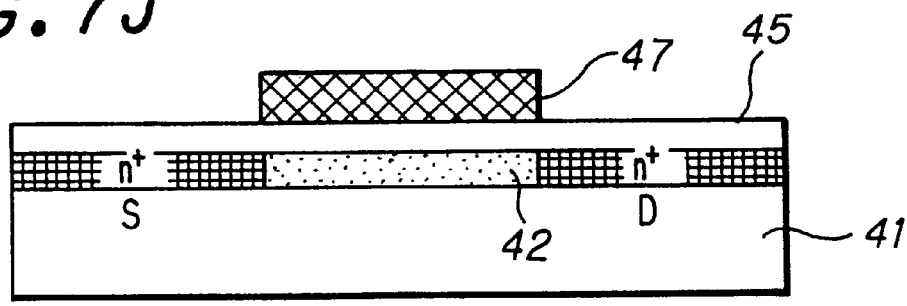
Figure 7K:
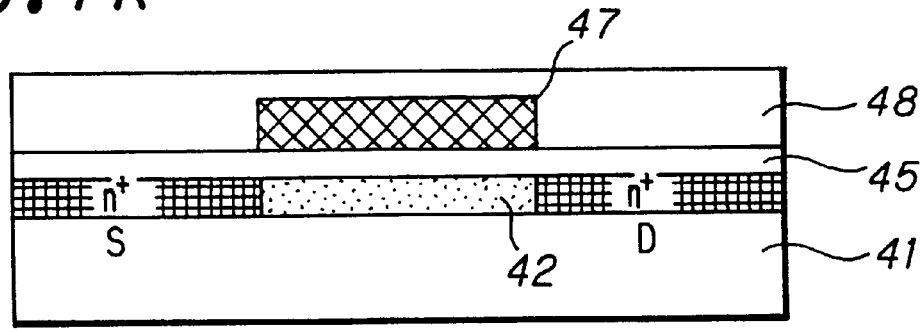
Figure 7L:
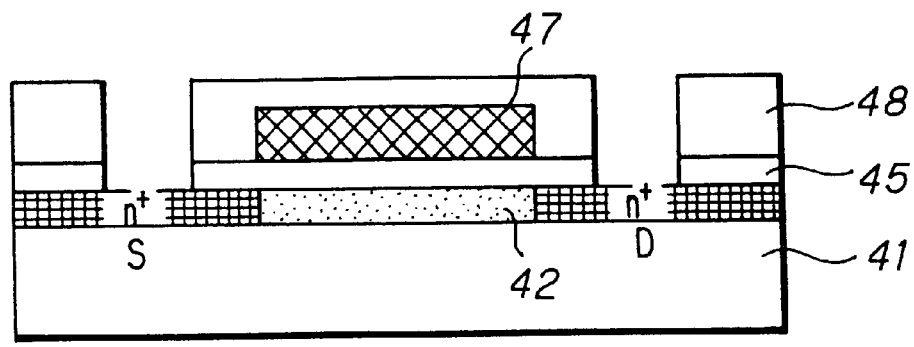

Subsequently, a metal film 46 formed of alloy of aluminum and silicon is formed in a process of FIG. 7I, and then the metal film is patterned in a desired shape to form a gate electrode 47 in a process of FIG. 7J. This patterning is performed with phosphoric acid by a wet etching treatment. Thereafter, a first layer insulating film 48 of PSG is formed by a CVD method in a process of FIG. 7K, and then contact holes are formed in the first layer insulating film 48 and the gate insulating film 45 by the wet etching treatment in a process of FIG. 7L.

Figure 7M:
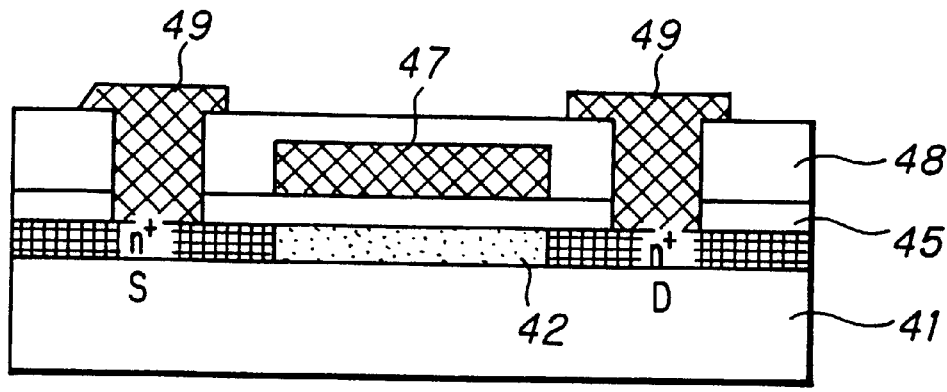
Figure 7N:
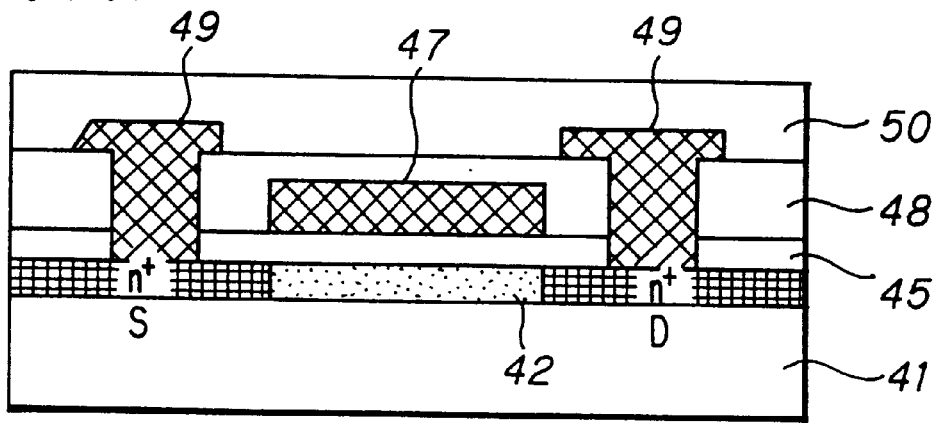
Figure 7O:
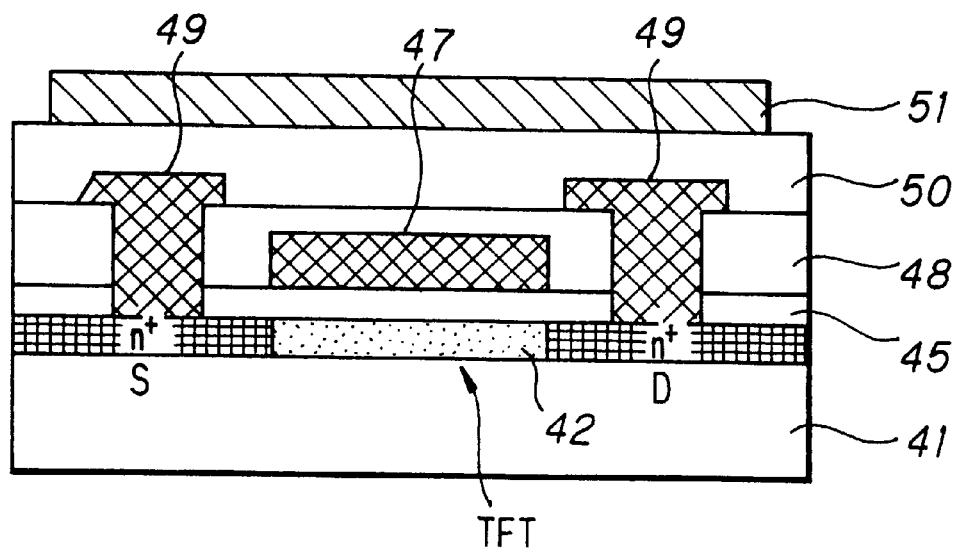

Subsequently, a metal aluminum film is formed by the patterning in a process of FIG. 7M, and then patterned in a desired shape to form wirings 49 which intercommunicate with the source region S and the drain region D. Thereafter, a second layer insulating film 50 of PSG is formed by the CVD method in a process of FIG. 7N, and then a P—SiN film 51 is formed by a plasma CVD method in a process of FIG. 7O. Thereafter, hydrogen is introduced into the silicon film 42 through the first layer insulating film 48 and the second layer insulting film 50 using the P—SiN film 51 as a cap film. Through the series of processes as described above, a planar type thin film transistor (TFT) is completed.

Next, another embodiment of the method of manufacturing semiconductor chips for display according to the present invention will be described in more detail with reference to FIGS. 10A to 12C.

Figure 8A:
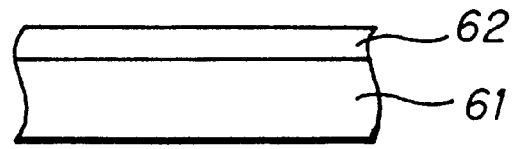
FIGS. 8A to 8D are diagrams showing a series of processes for another embodiment of the semiconductor chip manufacturing method according to the present invention.
Figure 8B:
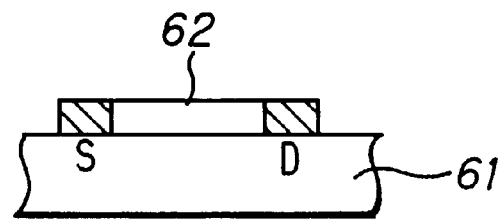
Figure 8C:
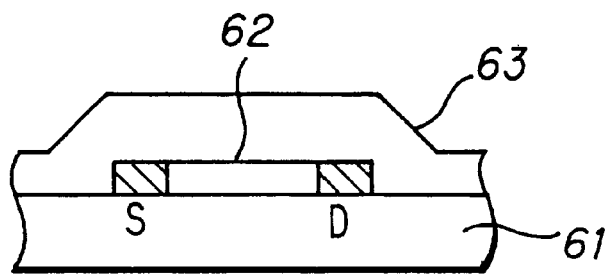
Figure 8D:
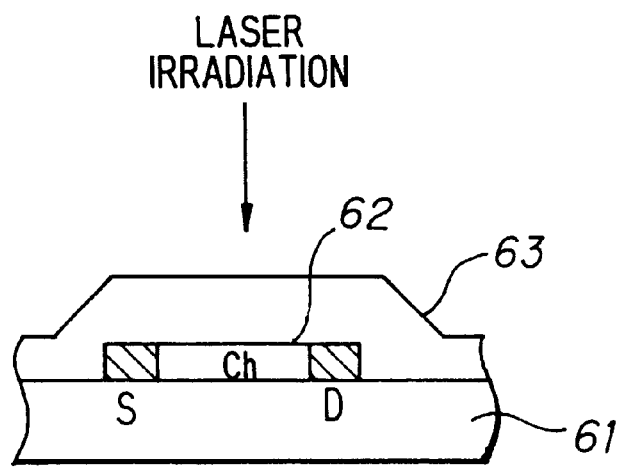

First, a transparent insulating substrate 61 is provided n a process of FIG. 8A. The transparent insulating substrate 61 is formed of glass material having a relatively low melting point, and its heat-resistance temperature slightly exceeds about 600° C. If necessary, a transparent insulating layer of $SiO_2$ or the like is formed on the surface of the transparent insulating substrate 61. However, in this embodiment the transparent insulating layer is not formed. Thereafter, a semiconductor thin film 62 serving as an active layer for a thin film transistor is formed on the transparent insulating substrate 61. For example, an amorphous silicon film or a polycrystal silicon film having fine grain size is formed by a pressure-reduced CVD method, for example. In this embodiment, the amorphous silicon film is deposited by the pressure-reduced CVD method. Subsequently, in a process of FIG. 8B, the amorphous silicon film 62 is patterned in a desired shape to form an element area for a thin film transistor. This patterning treatment may be performed after a laser annealing treatment as described later is performed. Impurities are doped into the element area by the ion implantation or the like to form a source region S and a drain region D. When an N-channel type thin film transistor is formed, arsenic is doped, and when a P-channel type thin film transistor is formed, boron is doped. The dose amount is set to about $3 \times 10^{15}/cm^2$. Subsequently, in a process of FIG. 8C, an antireflection film 63 is beforehand formed to improve the laser processing efficiency. The antireflection film is formed of $SiO_2$ or the like, and it is deposited at a thickness of 30 nm to 100 nm. The antireflection film 63 is required to be formed at a temperature which is not more than the heat-resistance temperature of the transparent insulating substrate 61. Subsequently, the laser pulse is irradiated from the side of the antireflection film 63 in a process of FIG. 8D. The energy of the laser pulse is set to 150 $mJ/cm^2$ to 500 $mJ/cm^2$, and its pulse width is set to 40 nanoseconds or more. With the laser irradiation, a portion of the silicon thin film 62 which serves as a channel region Ch is crystallized, and at the same time the impurities doped in the source region S and the drain region D are activated. The crystallization of the silicon film and the activation of the impurities can be performed by the one-shot irradiation of the laser pulse below the heat-resistance temperature of the transparent insulating substrate 61.

Figure 9:
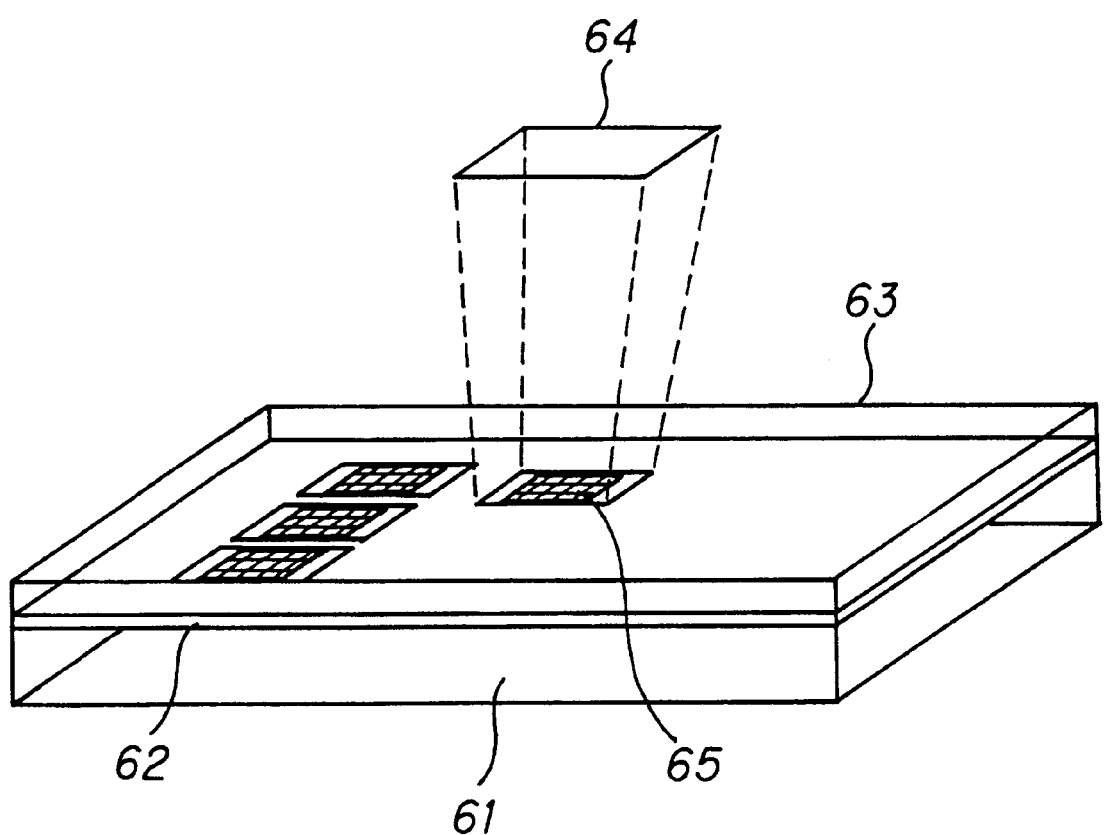
FIG. 9 is a schematic diagram showing a laser irradiation process which is performed in the process shown in FIG. 7D.

FIG. 9 is a schematic diagram showing an irradiation method of a laser beam. As shown in FIG. 9, a sectioned area 65 on which the laser beam 64 is irradiated by a single shot contains at least all of circuits and pixels which are used for a semiconductor chip for display.

Figure 10A:
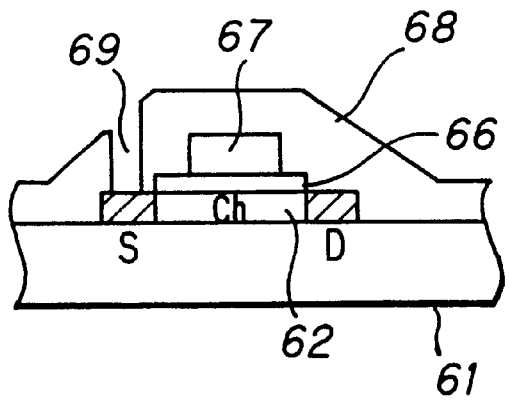
FIGS. 10A to 10C are schematic diagrams showing a series of processes for another embodiment of the semiconductor chip manufacturing method according to the present invention.
Figure 10B:
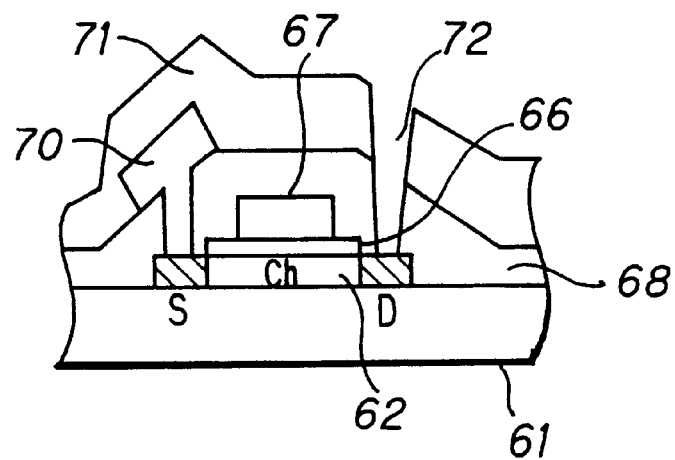
Figure 10C:
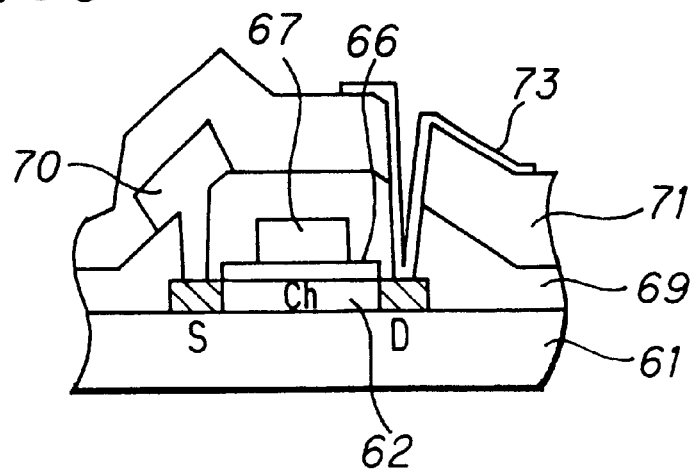

Subsequently, the process goes to a process of FIG. 10A to exfoliate the antireflection film 63 which is undesired after the laser irradiation. Thereafter, a gate insulating film 66 is formed on the channel region Ch. The gate insulating film 66 is formed of $SiO_2$, P—SiN or the like, and it has a thickness of about 150 nm. Thereafter, a gate electrode 67 is formed on the gate insulating film 66. Aluminum is used as material for the gate electrode 67, and it can be processed below 600° C. Subsequently, a first layer insulating film 68 of PSG is formed at a thickness of 500 nm. In the first layer insulating film 68 is formed a contact hole 69 which intercommunicates with the source region S. In a next process of FIG. 10B, a wiring 70 which intercommunicate with the source region S is patterned, and PSG is formed at a thickness of 500 nm on the wiring 70 to form a second layer insulating film 71. Thereafter, a contact hole 72 which intercommunicates with the drain region D through the second layer insulating film 71 and the first layer insulating film 68 is formed. Finally, in a process of FIG. 10C, ITO is formed on the second layer insulating film 71, and patterned in a desired shape to form a pixel electrode 73. Through the series of processes as described above, a pixel electrode driving thin film transistor which is contained in the matrix array of the semiconductor chip for display is completed.

According to this embodiment, the pulse time of the laser beam is set to 40 nanoseconds or more. Accordingly, the amorphous silicon thin film can be melted by one-shot irradiation, and thus crystallization can be uniformly performed. In this embodiment, the crystallization of the silicon thin film and the activation of the source and drain regions are performed simultaneously with each other, however, the laser irradiation may be performed before the source and drain regions are formed, whereby only the crystallization is performed. Furthermore, it is needless to say that the source region and the drain region are formed on the silicon thin film which has been already crystallized, and then the laser irradiation is performed again to activate these regions.

Next, a control method for crystallization by adjusting the temperature of the substrate when the laser irradiation is performed will be described with reference to FIGS. 11A to 11C. In the following description, processes until a process of forming an activation layer of a thin film transistor will be described.

Figure 11A:
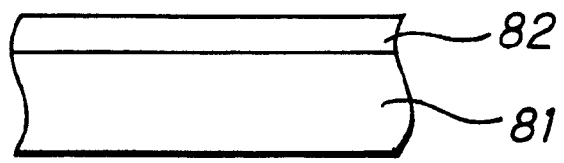
FIGS. 11A to 11C are schematic diagrams showing a series of processes for another embodiment of the semiconductor chip manufacturing method according to the present invention.
Figure 11B:
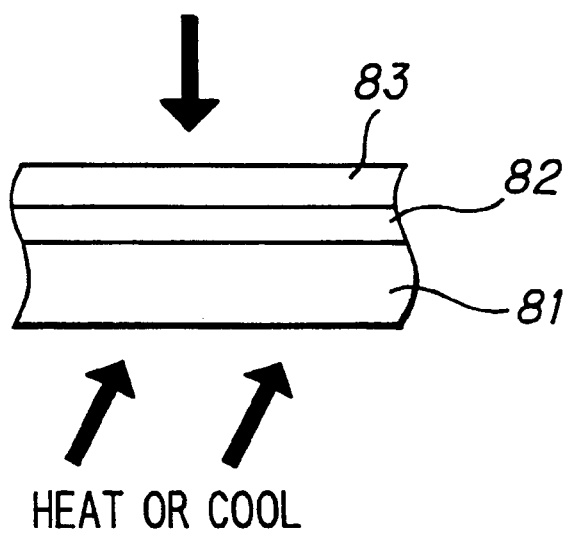
Figure 11C:
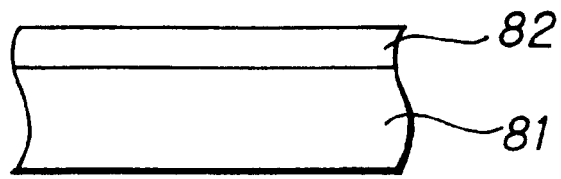

First, in a process of FIG. 11A, an amorphous or polycrystal (having minute grain size) silicon thin film 82 is formed on a transparent insulating substrate 81 having a heat-resistance temperature of about 600° C. In a next process of FIG. 11B, an antireflection film 83 is formed on the silicon film 82, and then a one-shot laser beam is irradiated thereto. When the laser irradiation is carried out, the transparent insulating substrate 81 is heated to a temperature between 100° C. and 500° C. or cooled to a temperature between −10° C. and 5° C. That is, the silicon thin film 82 is heated by the one-shot irradiation of the laser pulse while the temperature of the transparent insulating substrate is increased to the room temperature or more, or decreased to the room temperature or less, thereby controlling the grain size of the silicon thin film when the silicon thin film is crystallized. That is, the temperature gradient from the time when the silicon thin film 82 is melted by the laser irradiation until the time when it is solidified is adjusted.

When the temperature of the transparent insulating substrate is increased to more than the room temperature, the temperature gradient as described above is relatively moderate, so that the grain size is large. Conversely, when the temperature of the transparent insulating substrate 81 is decreased to less than the room temperature, the temperature gradient as described above is sharp, so that the grain size is small. Thereafter, the used antireflection film 83 is removed in a subsequent process of FIG. 11C, and a thin film transistor is completed in a subsequent process. In this embodiment, the laser irradiation is performed on the silicon thin film 82 before source and drain regions are formed to crystallize only the silicon thin film 82. In place of this operation, crystallization of the silicon thin film and activation of the source and drain regions can be simultaneously performed by performing the laser irradiation afterwards. Furthermore, if the source and drain regions are formed on the silicon thin film which has been already crystallized and the laser irradiation is performed again, the activation of the source and drain regions can be performed. In this case, the control of the grain size is performed with the first laser pulse irradiation, and then the activation of the impurities is controlled by the second laser pulse irradiation.

The relationship between a substrate temperature and a grain size is shown in the following Table 2.

TABLE 2

| SUBSTRATE TEMP. (° C.) | AVERAGE PARTICLE SIZE(nm) |
|---|---|
| 25 | 115 |
| 200 | 163 |
| 0 | 43 |

The table 2 shows data on the average crystal particle diameter (grain size) and when the laser irradiation (energy of 350 $mJ/cm^2$) is performed to crystallize in a state where the substrate is heated or cooled. In this case, a sectioned area which is subjected to one-shot laser irradiation contains at least all the circuits and pixels in a semiconductor chip for display. When the substrate temperature was kept at the room temperature (25° C.), the average particle diameter was equal to 115 nm. When the substrate temperature was increased to 200° C., the average particle diameter was equal to 163 nm. Conversely, when the substrate temperature was decreased to 0° C., the average particle diameter was equal to 43 nm. In general, as the grain size is larger, the device characteristics of the thin film transistor are more improved, however, they tend to be more dispersive between individual thin film transistors. On the other hand, as the grain size is smaller, the dispersion of the device characteristics can be suppressed, however, the performance of the thin film transistor itself is lowered. Therefore, the grain size is required to be controlled in accordance with the characteristics to be required for the thin film transistor.

Next, with reference to FIGS. 12A and 12B will be described an effect that the grain size can be controlled by setting the thickness of the semiconductor thin film, serving as a laser irradiation target, to be smaller than the laser absorption depth.

As shown in FIG. 12A, an amorphous silicon thin film 82 was formed at a thickness of 140 nm on a transparent insulating substrate 81. That is, the thickness of the silicon thin film 82 was set to be smaller than the absorption depth of the laser to be irradiated onto the thin film 82. For example, the wavelength of a XeCl excimer laser is 308 nm, and the absorption depth of the amorphous silicon thin film for the laser is equal to 160 nm. Accordingly, in this embodiment the thickness of the silicon thin film 82 is set to 140 nm which is smaller than the absorption depth of 160 nm. Subsequently, as shown in FIG. 12B, an antireflection film 83 was formed on the amorphous silicon film 82, and then one-shot irradiation of a laser pulse having wavelength of 308 nm was performed. At this time, the energy density of the laser beam was set to 350 mJ/cm$^2$, For comparison, one-shot laser irradiation was conducted using a KrF excimer laser under the same condition. The KrF excimer laser has the wavelength of 248 nm, and the absorption depth of the amorphous silicon thin film for the KrF excimer laser is equal to 131 nm. Accordingly, when the KrF excimer laser is used, the thickness 140 nm of the silicon thin film 82 is larger than the absorption depth 131 nm.

The following table 3 shows a measurement result of average particle size. When the laser pulse having the laser absorption depth of 160 nm was irradiated onto the amorphous silicon thin film having a thickness of 140 nm by one shot, the average particle size was equal to 1640 nm. On the other hand, when the laser pulse having the laser absorption depth of 131 nm is irradiated onto the amorphous silicon thin film having a thickness of 140 nm by one shot, the average particle size was equal to 1105 nm.

TABLE 3

| LASER ABSORPTION LENGTH (nm) | AVERAGE PARTICLE SIZE (nm) |
| --- | --- |
| 160 | 1640 |
| 131 | 1105 |

As is apparent from the above result, when the absorption depth of the laser is larger than the thickness of the semiconductor thin film, the semiconductor thin film is wholly melted by irradiating the laser beam having the same energy, so that a large grain size can be obtained in the crystallization process. On the other hand, when the thickness of the semiconductor thin film is larger than the absorption depth of the laser, there occurs a portion which is hardly melted because the laser cannot reach that portion, and thus a cooling process at that portion proceeds rapidly, so that the grain size is small. In this embodiment, the laser irradiation is performed before the source and drain regions are formed, thereby performing only the crystallization of the silicon thin film. However, in place of this process, the crystallization and the activation of the source and drain regions can be performed at the same time. Furthermore, after the source and drain regions are formed on the semiconductor thin film which was crystallized by a first laser irradiation, only the activation of the source and drain regions may be selectively performed by a second laser irradiation. The size control of the grain size can be performed by the first laser irradiation, and the control of the activation degree of the impurities can be performed by the next laser irradiation. At this time, the diffusion of the impurities in a lateral direction can be made uniform in the source and drain regions of the laser-irradiated semiconductor thin film, so that the dispersion in electrical characteristics of the transistor is reduced.

FIG. 13 is a graph showing a comparison result between the electrical characteristics of a thin film transistor formed by the present invention and the electrical characteristics of a thin film transistor formed by the prior art. The abscissa of the graph represents a gate voltage VSG, and the ordinate of the graph represents a drain current IDS. As shown in FIG. 13, the electrical characteristics of the thin film transistor of the present invention are more improved than those of the conventional thin film transistor, and on-current is higher while off-current is lower.

Figure 14:
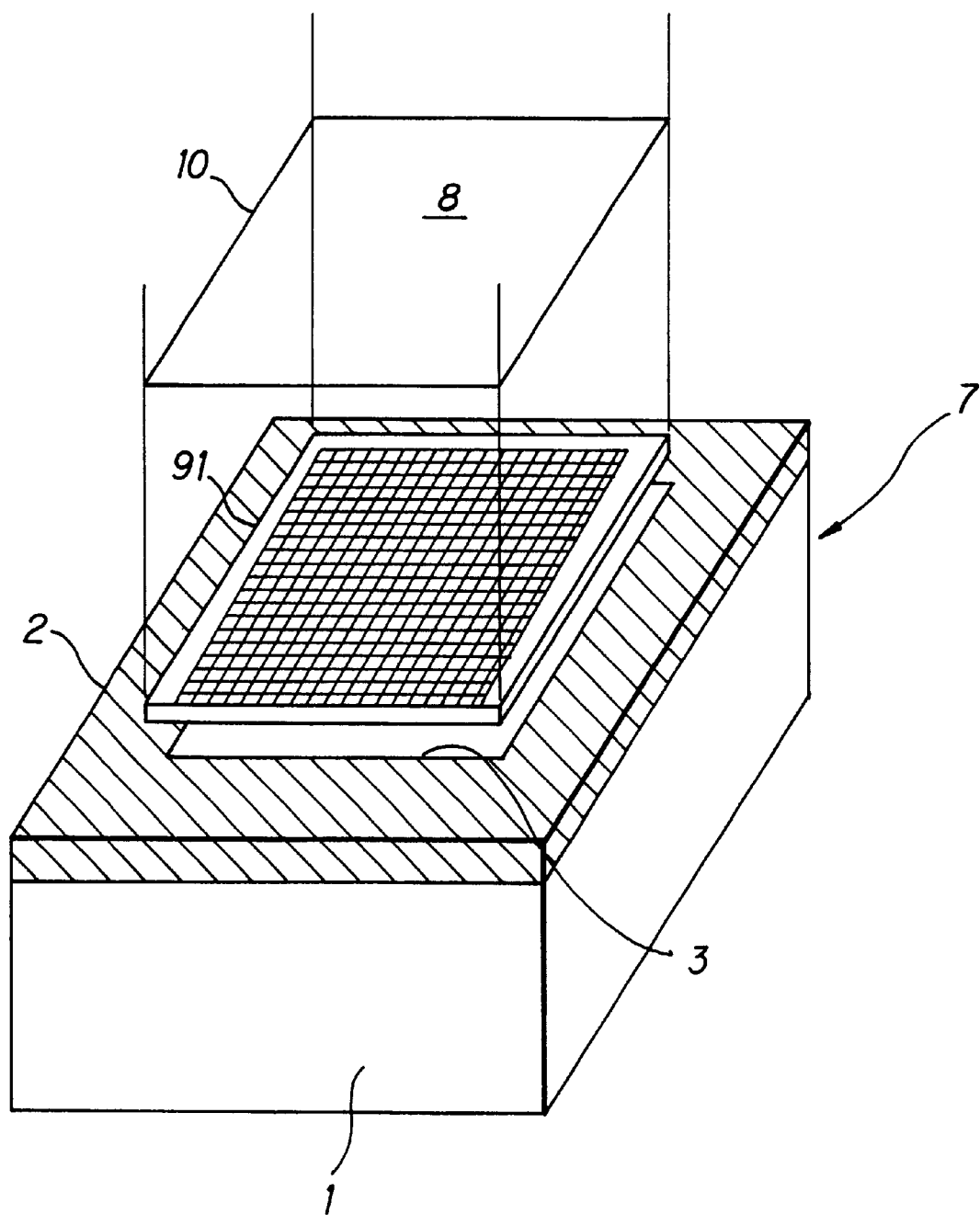
FIG. 14 is a schematic diagram showing a laser beam irradiation method using a microlens array.

FIG. 14 is a perspective view showing a modification of the laser irradiation method shown in FIG. 3. The elements corresponding to those of FIG. 3 are represented by the same reference numerals. In this embodiment, the laser pulse 8 is also irradiated to a desired section area 3 by one shot to conduct the batch heat treatment on the semiconductor thin film 2 of one chip for crystallization. A different point resides in that a microlens array 91 is interposed between the excimer laser source (not shown) and the semiconductor thin film 2, and the laser pulse 8 is selectively concentrated on a portion of the semiconductor thin film which is used as an element area of each thin film transistor. With this system, the use efficiency of the laser energy is increased, and a processing time for crystallization can be shortened.

Figure 15:
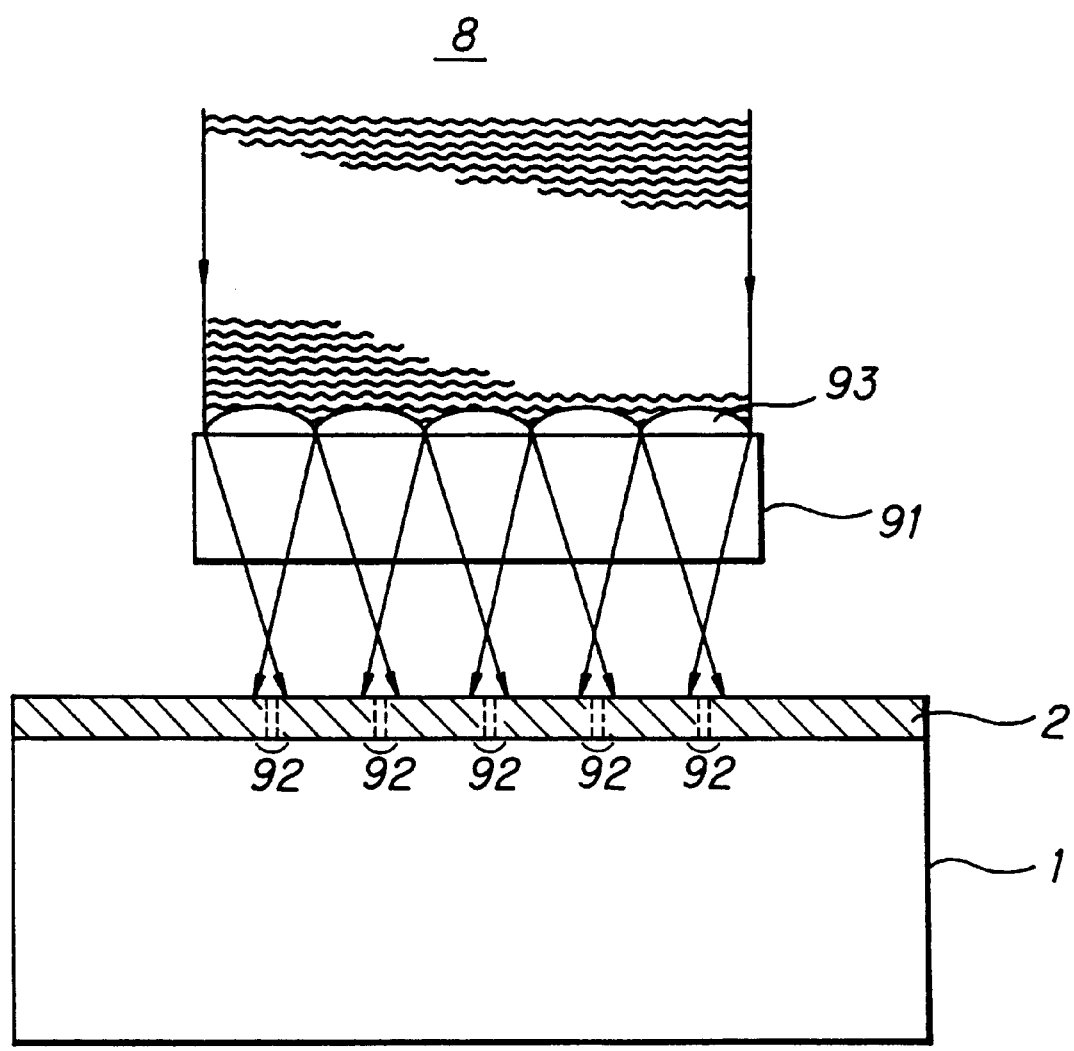
FIG. 15 is a cross-sectional view showing the microlens array to explain the function of the microlens array.

FIG. 15 is a cross-sectional view showing an optical action of the microlens array 91. As described above, integrated thin film transistors for driving pixel electrodes are formed on the matrix array portion of the semiconductor chip for display. The remaining portion of the semiconductor thin film except for the element areas on which the thin film transistors are formed, are removed by the patterning treatment to make the matrix array portion transparent. Accordingly, it is unnecessary to crystallize the portion of the semiconductor thin film 2 which excludes the element areas 92 shown in FIG. 15, and thus it is sufficient to irradiate the laser pulse 8 to only the element areas 92. Accordingly, when the laser pulse 8 is irradiated in a state where the respective microlenses 93 formed on the microlens array 91 and the element areas 92 are aligned with one another, the laser beam can be concentrated on only the element areas 92.

Figure 16:
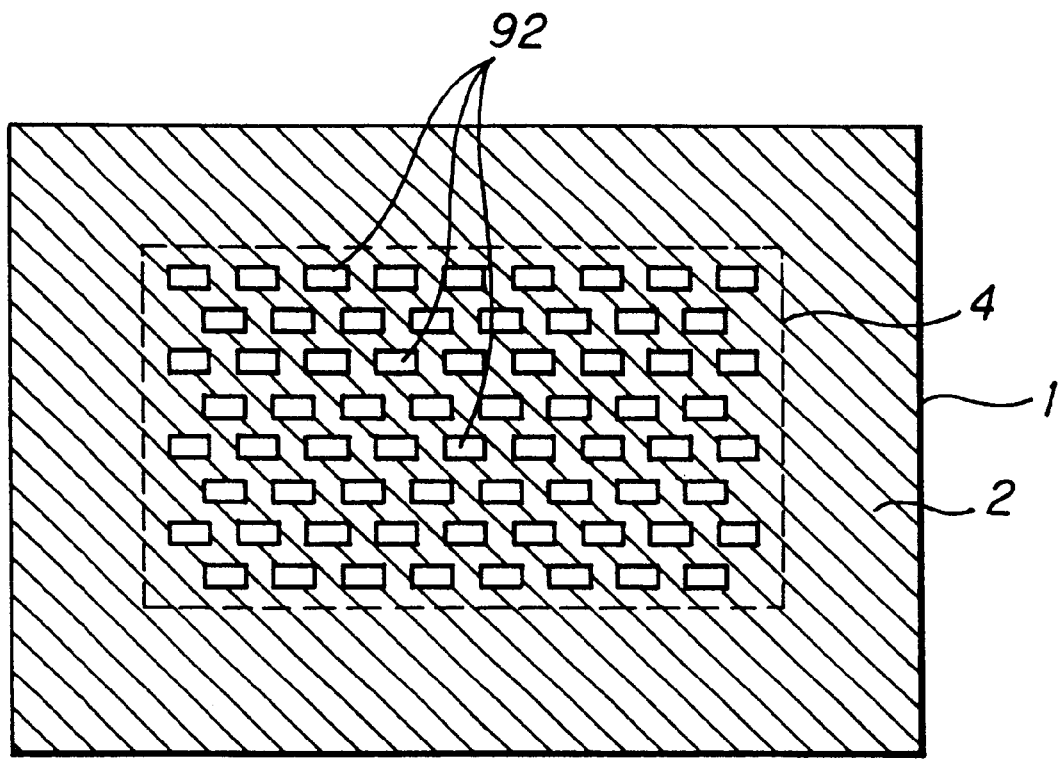
FIG. 16 is a schematic diagram showing a surface state of a semiconductor thin film which was subjected to laser irradiation through the microlens array.

FIG. 16 is a plan view showing the semiconductor thin film 2 shown in FIG. 15. Only the element areas 92 in the matrix array are selectively exposed to the laser pulse, and crystallized. The semiconductor thin film 2 at the other areas are kept in an amorphous state. At least inside of the matrix array 4, the semiconductor thin film 2 at the amorphous state is removed in a subsequent etching process. The horizontal scanning circuit and the vertical scanning circuit shown in FIG. 3 may be provided outside of the matrix array 4. In this case, like the matrix array 4, the one-shot irradiation of the laser pulse must be performed to crystallize the semiconductor thin film at these areas. The laser pulse may be irradiated onto these areas directly or through the microlens array like the matrix array 4.

As described above, a sectioned area having a relatively large area of about 1 to 10 cm square can be crystallized with only one laser-pulse irradiation using a high output power laser device. In this system, the cross-sectional intensity distribution of the laser pulse is set to be constant by irradiating the laser pulse through an optical system called as a homogenizer so that the crystallization of the semiconductor thin film is made uniform within the section area which is exposed to the laser beam. However, with respect to the laser annealing process for a relatively large sectioned area, heat radiation occurs from the peripheral portion of a laser pulse irradiation area. Therefore, if the cross-sectional intensity distribution of the laser pulse is constant over the whole irradiation area, the cooling speed at the peripheral portion of the sectioned area is higher than the cooling speed at the central portion. Accordingly, the temperature gradient in the crystallization process becomes larger at the peripheral portion than at the central portion, and thus the grain size at the peripheral portion becomes smaller than that at the central portion. Therefore, the crystallinity of the semiconductor thin film cannot be uniform over the same sectioned area. If a transistor is formed of such a semiconductor thin film having non-uniform crystallinity as described above, dispersion in TFT's characteristics would occur in the same chip due to the difference in grain size. In order to avoid such a disadvantage is proposed a method of selectively forming an antireflection film along the peripheral portion of the laser irradiation area to substantially increase the temperature of the peripheral portion, thereby improving the crystallinity in the laser irradiation area. However, this method needs a process of beforehand forming an antireflection film on the semiconductor thin film by the patterning treatment, and thus it induces increase in the number of processes.

Figure 17:
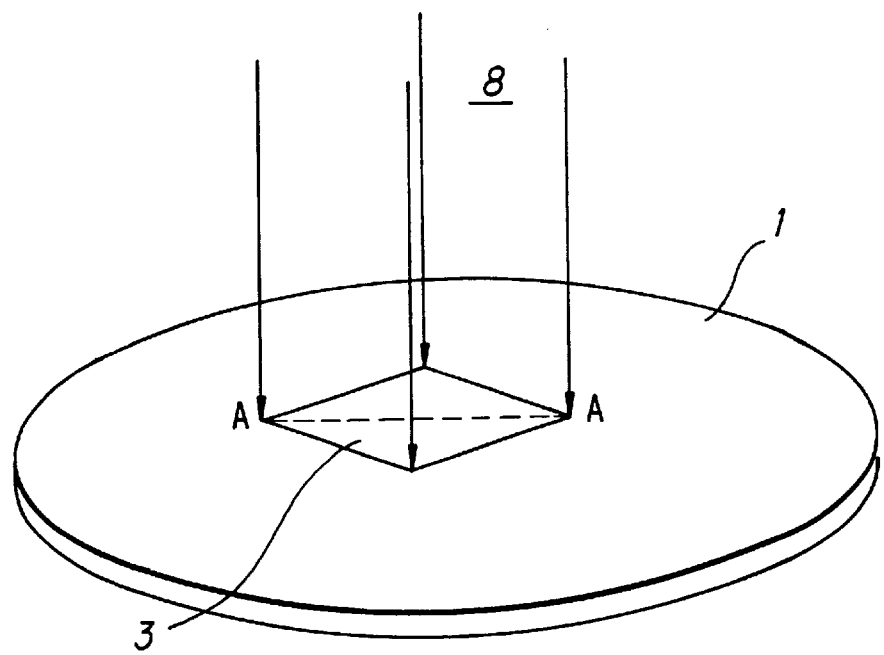
FIG. 17 is a schematic diagram showing an improved example of the laser irradiation process according to the present invention.

In view of the foregoing, in an embodiment shown in FIG. 17, the cross-sectional intensity distribution of the laser pulse 8 is controlled so that the irradiation energy density increases more from the central portion of the sectioned area 3 to the peripheral portion thereof, and the one-shot irradiation of the laser beam having such a cross-sectional intensity distribution is performed.

As shown in FIG. 17, an amorphous silicon film is first formed on an insulating substrate 1 (wafer) formed of glass material having low melting point or the like. The amorphous silicon film may be formed by the plasma CVD method or by a magnetron sputtering method. The amorphous silicon film may be formed by thermally decomposing $Si_2H_6$, $SiH_4$ or the like under a substrate temperature condition of about 500° C. with the LPCVD method, or a polycrystal silicon film which is formed by he LPCVD method or the like may be made amorphous by implanting Si cations into the film. In this embodiment, mixture gas of $SiH_4$ and hydrogen was used as raw gas, and the amorphous silicon film was formed under the condition of the substrate temperature of 150 to 250° C. by the plasma CVD method. "7059 glass" produced by Corning Company was used as the insulating substrate 1. A large amount of hydrogen is contained in the amorphous silicon film which has been just formed, and thus the substrate was heated at 450° C. under nitrogen gas atmosphere and annealed for 30 minutes to discharge hydrogen gas therefrom. The one-shot irradiation of the laser pulse 8 was performed on a prescribed sectioned area 3 of the amorphous silicon film. In this case, the excimer laser pulse of 308 nm wavelength was irradiated under the following condition: laser energy density of 150 to 450 mJ/$cm_2$, pulse duration time of about 100 to 1000 ns and substrate temperature of 20 to 450° C. The sectioned area 3 which was a target to be irradiated with a laser beam was designed in a size of 5×5 $cm^2$.

Figure 18:
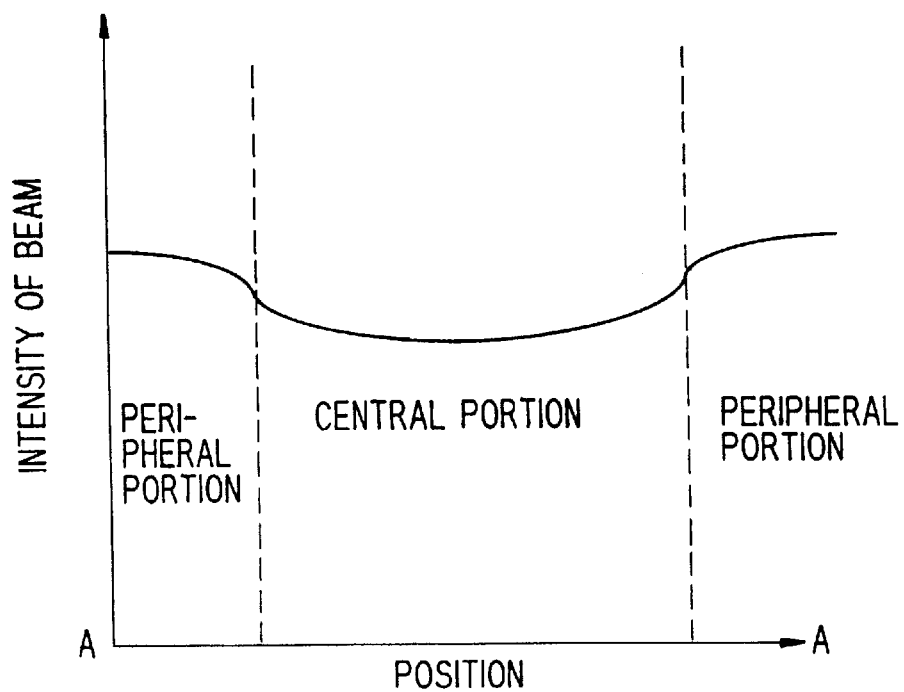
FIG. 18 is a graph showing the cross-sectional intensity distribution of a laser pulse shown in FIG. 17.

FIG. 18 is a graph showing a cross-sectional intensity distribution of the laser pulse 8 which is taken along a diagonal line A—A of the sectioned area 3. As show in FIG. 18, the laser beam intensity is set so as to be low at the central portion of the sectioned area serving as the irradiation target and high at the peripheral portion thereof. Specifically, the laser beam intensity at the peripheral portion is set to be higher than that at the central portion by about 1 to 70%. FIG. 18 shows the cross-sectional intensity distribution along the diagonal line A—A shown in FIG. 17, however, the same intensity distribution is also obtained along another direction. Accordingly, the shape which is obtained by rotating the profile of FIG. 18 around a perpendicular passing the center point of the diagonal line A—A represents a three-dimensional energy distribution of the laser pulse. By setting the energy distribution as described above, the temperature reduction from the peripheral portion due to heat radiation can be prevented, and thus the uniform grain size can be obtained over the whole sectioned area which is the laser-irradiation target. Such a cross-sectional intensity distribution of the laser pulse can be realized by relatively increasing the beam intensity at the peripheral portion and relatively decreasing the beam intensity at the central portion with a simple optical system.

The average grain size in the central portion of 1 $cm^2$ and the grain size at the central portion of 1 $cm^2$ in the sectioned area of 5×5 $cm^2$, are shown in the following table 4. For comparison, in the table 4 are also shown the grain sizes at the central and peripheral portions of 1 $cm^2$ of the prior art in which only a homogenizer is use. The grain size was measured by a plan TEM. The data shown in the table 4 were obtained by performing the laser anneal at the substrate temperature of 400° C.

TABLE 4

| | GRAIN SIZE (nm) | |
|---|---|---|
| POSITION | PRESENT INVENTION | PRIOR ART |
| CENTRAL PORTION | 100 TO 150 | 100 TO 150 |
| PERIPHERAL PORTION | 90 TO 150 | 10 TO 90 |

As is apparent from the table 4, in the prior art the grain size at the central portion ranges from 100 to 150 nm while the grain size at the peripheral portion ranges from 10 to 90 nm. Accordingly, a large difference in the grain size occurred in the same sectioned area. On the other hand, in the present invention, the grain size at the central portion ranges from 100 to 150 nm while the grain size at the peripheral portion ranges from 90 to 150 nm, and a substantially uniform grain size could be obtained in the same sectioned area. In this embodiment, the laser beam annealing treatment is described. However, the present invention is applicable to an annealing treatment using electron beam.

Figure 19:
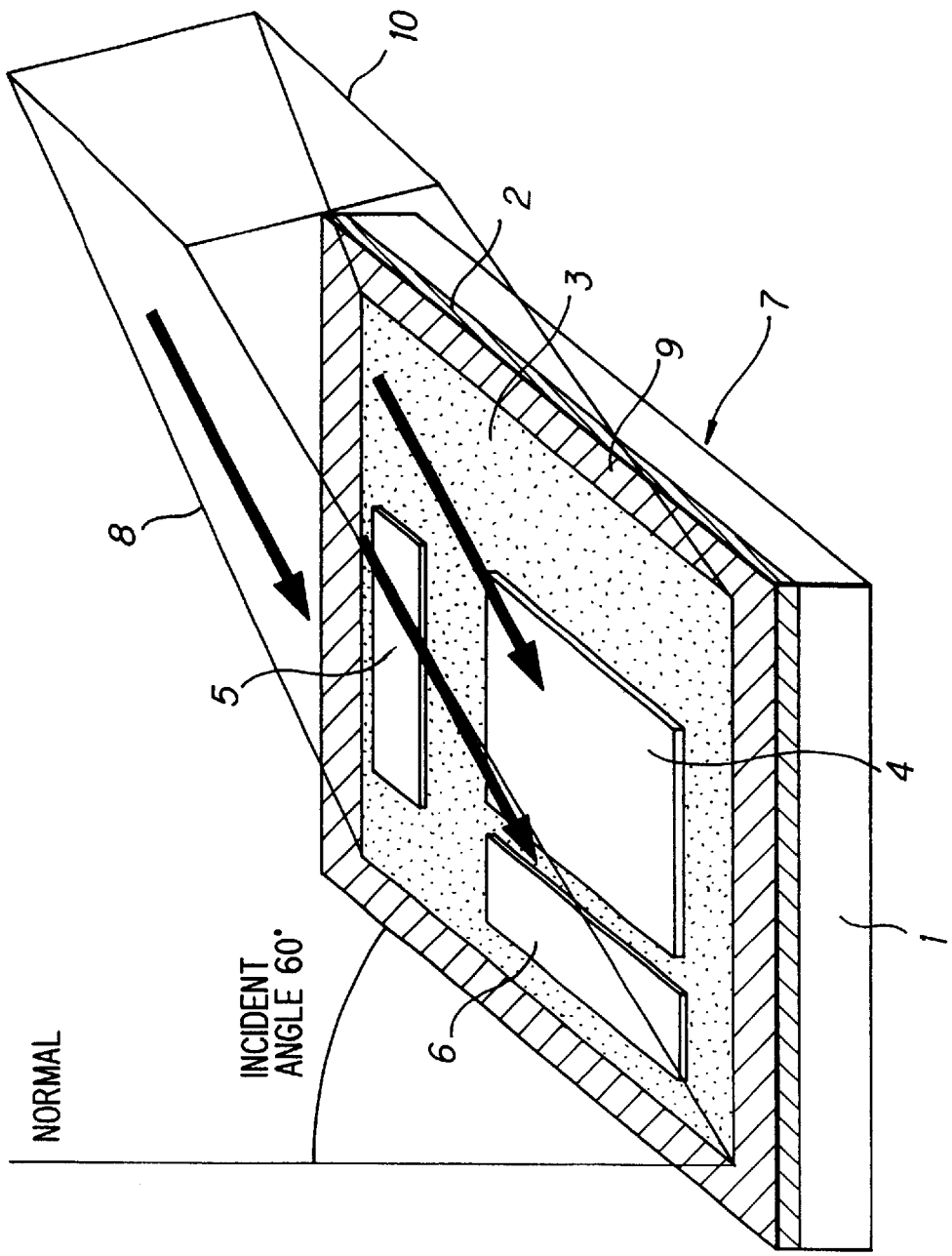
FIG. 19 is a schematic diagram showing an improved example (oblique laser irradiation method) of the conventional laser irradiation process.

FIG. 19 is a perspective view showing a modification of the laser irradiation method shown in FIG. 3. The elements corresponding to those of FIG. 3 are represented by the same reference numerals.

In this embodiment, the one-shot irradiation of the laser pulse 8 is also performed on a prescribed sectioned area 3 to perform the batch heat treatment on the semiconductor thin film 2 of one chip, thereby crystallizing the thin film. The different point is as follows. In place of the vertical laser irradiation method shown in FIG. 3, an oblique laser irradiation method is adopted. Specifically, the laser pulse 8 is irradiated within an incident angle of 30 to 60° to the normal direction of the insulating substrate 1. With this irradiation, a sectioned area 3 which is larger than the cross section 10 of the laser pulse 8 can be subjected to the batch heat treatment. However, the irradiation energy density per unit area is more reduced in the oblique laser irradiation than in the vertical laser irradiation. If the incident angle is smaller than 30°, the irradiation energy density is reduced by a large amount and thus there occurs a case where the crystallization of the semiconductor thin film 2 is not sufficiently performed. Furthermore, if the incident angle is larger than 60°, the enlargement effect of the irradiation area is not remarkable. Accordingly, in this embodiment, the incident angle is set to just 60° for oblique laser irradiation. With this irradiation, the area of the sectioned area 3 can be increased to be twice as large as the cross-sectional area of the laser pulse 8. In this embodiment, the semiconductor thin film 2 of amorphous silicon is crystallized by the batch heat treatment using the oblique laser irradiation. in this case, the batch heat treatment is performed in a state where the insulating substrate 1 is beforehand kept at a temperature of 550° C. to 650° C., and thus the crystallization of the amorphous silicon can be promoted while compensating for reduction in the irradiation energy density.

As described above, in this embodiment, the oblique laser irradiation is performed at the incident angle of 60°, and the sectioned area 3 whose area is twice as large as that in the vertical laser irradiation system can be crystallized. At the same time, the insulating substrate is beforehand heated at the temperature of 550° to 650° C., and in this state the crystallization is performed. This substrate temperature is a condition to perform solid-phase growth of silicon, and the crystal size and its uniformity are improved through an interaction with the laser irradiation. The amorphous silicon under the condition that the substrate is heated has such energy that its lattice structure is made variable, and in this state the crystallization thereof is promoted with a relatively small temperature increase. By irradiating the laser pulse in this state, the amorphous silicon is shifted to polycrystal silicon in a short time. As compared with the case where the laser irradiation is started from the room temperature, the ununiformity of the temperature distribution in the substrate at the laser irradiation time can be suppressed, and thus the grain size of the silicon film can be stabilized.

The matrix array 4, the horizontal scanning circuit 5 and the vertical scanning circuit 6 are formed in the sectioned area 3 to which the laser beam is irradiated to form the semiconductor chip 7 for display. The semiconductor chip 7 for display contains the total number of thin film transistors which reaches 100 kbits or more, and it has a chip size of 28 mm or more in diagonal dimension. The laser pulse 8 having a wavelength of 300 nm to 350 nm is irradiated onto the sectioned area 3, and the energy density of the laser pulse 8 is set to 200 mJ/cm$^2$ to 400 mJ/cm$^2$. No thin film transistor is formed on a laser non-irradiation area, and it serves as a separation band 9 between semiconductor chips for display.

Figure 20:
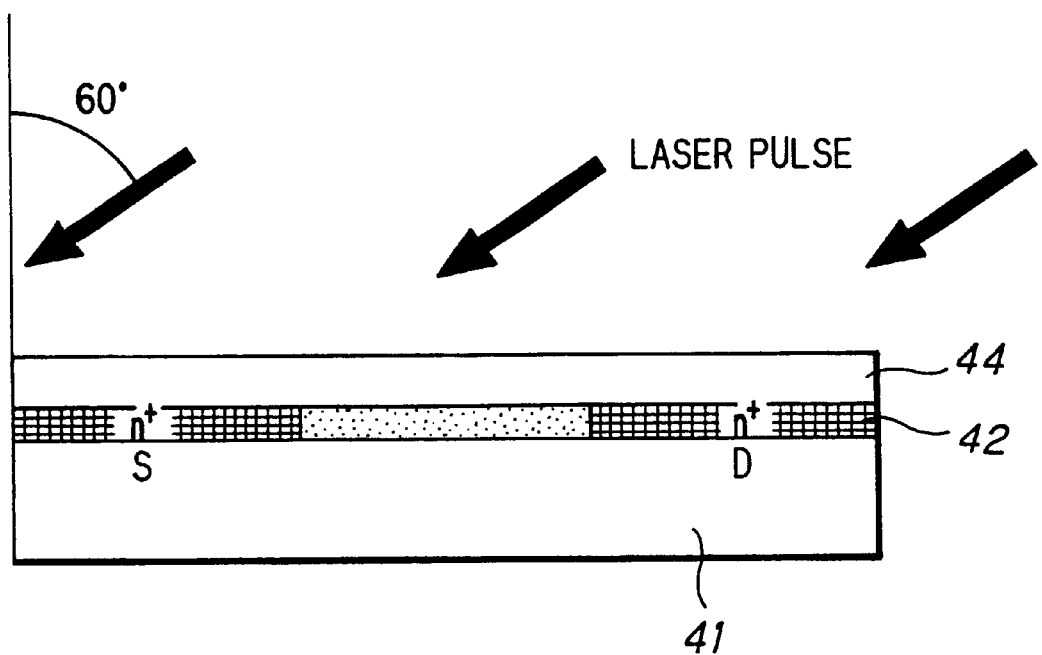
FIG. 20 is a cross-sectional view showing the oblique laser irradiation method shown in FIG. 3.

FIG. 20 is a cross-sectional view showing an example of the oblique laser irradiation process shown in FIG. 3. This oblique laser irradiation process is carried out in place of the vertical laser irradiation process shown in FIG. 7F. In this view point, the elements corresponding to those of the process shown in FIG. 7F are represented by the reference numerals to make the understanding clear.

As shown in FIG. 20, an amorphous silicon film 42 is formed on the surface of a transparent insulating substrate 41 of quartz or the like. The amorphous silicon film 42 is beforehand selectively doped with high-concentration impurities by the ion implantation method to form a source region S and a drain region D of a thin film transistor. Furthermore, in order to improve the laser irradiation efficiency, a non-reflective coating 44 formed of SiO$_2$, SiN, SiON or the like is formed to improve an absorption efficiency of irradiation energy. In this sate, the laser pulse is obliquely irradiated to perform the crystallization of the amorphous silicon film 42 and the activation of the source and drain regions S and D at the same time. Thereafter, the non-reflective coating 44 at the upper side is removed by the etching treatment to leave only the crystallized silicon film 42. Thereafter, the patterning treatment is conducted using a photoresist, and an undesired portion of the silicon film 42 is removed by a dry etching treatment to form an element area. Thereafter, an SiO$_2$ film is formed as a gate insulating film on the element area by the pressure-reduced CVD method or the like. Thereafter, a metal film of AlSi or the like is formed, and patterned into a gate electrode. Subsequently, a first layer insulating film of PSG or the like is formed, contact holes are formed and then wirings which are connected to the source region S and the drain region D are formed through the contact holes. Finally, a second layer insulating film of PSG or the like is formed, and a P—SiN film is superposed on the second layer insulating film by the plasma CVD method to perform a hydrogen treatment. The processes as described above are identical to those of the manufacturing process shown in FIGS. 7A to 7O except that the oblique laser irradiation is used in place of the vertical laser irradiation.

As described above, according to the present invention, the one-shot irradiation of the laser pulse is conducted on a prescribed sectioned area to perform the batch heat treatment on a semiconductor thin film of one chip. With this operation, the heat processing time of the semiconductor thin film by the laser irradiation can be shortened, and thus the mass-production of the semiconductor thin films can be performed. Furthermore, crystals having excellent uniformity can be obtained, so that the process condition is stabilized and the uniformity of the thin film transistor characteristics can be secured. Therefore, a large-area semiconductor chip for display which contains scanning circuits, etc. on the same substrate can be formed.

According to the present invention, the semiconductor thin film is crystallized by the batch heat treatment which is performed by the one-shot irradiation of the laser pulse. Therefore, the crystallization of the semiconductor in the sectioned area is uniformly promoted to thereby suppress the dispersion in the electrical characteristics of integrated thin film transistors which are formed on the semiconductor chip for display.

According to the present invention, after the impurities are doped into the semiconductor thin film, the one-shot irradiation of the laser pulse is performed to activate the impurities through the batch heat treatment which is enabled by the one-shot irradiation. With this operation, the diffusion of the impurities along a lateral direction in the source region and the drain region of the laser-irradiated semiconductor thin film can be made uniform to stabilize the electrical characteristics of the thin film transistor.

According to the present invention, the one-shot irradiation of the laser pulse is performed on each sectioned area except for the separation band which is provided between the neighboring sectioned areas. With this operation, the scribe line for each chip along the separation band is clarified, and for example in a fabrication process of a liquid crystal cell or the like, the alignment precision is improved.

According to the present invention, the one-shot irradiation of the laser pulse is performed for the pulse time which is set to 40 nanoseconds or more. By lengthening the time of the one laser pulse irradiation, the semiconductor thin film can be sufficiently melted with one laser irradiation. The improvement in uniformity of crystallinity and in throughput can be expected.

According to the present invention, the one-shot irradiation of the laser pulse is performed to perform the batch heat treatment in a state where the temperature of the insulating substrate is increased to the room temperature or more or decreased to the room temperature or less. With this operation, the cooling speed of the semiconductor thin film which is temporarily melted can be adjusted. Accordingly, the crystallization of the semiconductor thin film, the diffusion length of the source and drain regions of the semiconductor thin film and the activation of the impurities can be controlled.

According to the present invention, the semiconductor thin film is formed at a thickness which is smaller than the absorption length of the laser pulse. Therefore, the semiconductor thin film can be perfectly melted, and the grain size of crystals can be easily increased.

According to the present invention, the one-shot irradiation of the laser pulse is performed through the microlens array to selectively concentrate the laser energy on the element area of each thin film transistor. Accordingly, the laser energy can be efficiently used.

According to the present invention, the one-shot irradiation is performed while the cross-sectional intensity distribution of the laser pulse is controlled so that the irradiation energy density increases more from the central portion of a prescribed sectioned area toward the peripheral portion. Therefore, the crystallinity can be kept uniform within the beam irradiation area in the batch laser annealing process for a large area.

According to the present invention, the oblique laser irradiation system in which the laser pulse is irradiated in an oblique direction to the insulating substrate is performed. Accordingly, an irradiation area which is larger than the cross-sectional area of the laser pulse can be thermally treated at the same time, so that the semiconductor manufacturing process can be still more efficiently performed. Furthermore, by heating the insulating substrate together with the oblique laser irradiation system, the crystallization of the semiconductor thin film can be promoted.

What is claimed is:

1. A method of manufacturing a wafer including a plurality of array substrates each including a matrix array for a display and a peripheral circuit, comprising the steps of:

providing an insulating wafer substrate including a surface;

forming a semiconductor thin film on said insulating wafer substrate;

processing the semiconductor thin film to form integrated thin film transistors each of which comprises a polycrystalline semiconductor thin film as an active layer, said processing step including a step of irradiating a rectangular-shaped pulsed laser to crystallize a sectional area of the semiconductor thin film by a single shot, one sectional area at a time, said pulsed laser having a duration time of about 40 nanoseconds or more.

2. The method as claimed in claim 1, wherein said laser-irradiation step includes a step of irradiating a one-shot laser pulse onto an individual sectioned area except for a separation band which is provided between neighboring sectioned areas.

3. The method as claimed in claim 1, wherein said laser-irradiation step includes a step of controlling the temperature of the insulating substrate to control the crystallization of the semiconductor thin film.

4. The method as claimed in claim 1, wherein said laser-irradiation step includes a step irradiating a one-shot laser pulse through a microlens array to selectively concentrate the laser pulse on a portion of the semiconductor thin film which corresponds to an element area of an individual thin film transistor.

5. The method as claimed in claim 1, wherein said semiconductor film forming step includes a step of forming the semiconductor thin film at a thickness which is smaller than a laser pulse absorption depth.

6. The method as claimed in claim 1, wherein said laser-irradiation step includes a step of irradiating the one-shot laser pulse while controlling the cross-section intensity distribution of the laser pulse so that the irradiation energy density increases more from the central portion of a sectioned area toward the peripheral portion thereof.

7. The method as claimed in claim 1, wherein said laser-irradiation step includes a step of irradiating the laser pulse in an oblique direction to the insulating substrate.

8. The method as claimed in claim 7, wherein said oblique laser irradiation step includes a step of irradiating the laser pulse at an incident angle of 30° to 60° to a normal direction of the insulating substrate.

9. The method as claimed in claim 7, wherein said oblique laser irradiation step includes a step of crystallizing the semiconductor thin film of amorphous silicon by a batch heat treatment.

10. The method as claimed in claim 9, wherein said oblique laser irradiation step includes a step of performing the batch heat treatment in a state where the insulating substrate is maintained at a temperature of 550° C. to 650°, thereby promoting the crystallization of amorphous silicon.

11. A method as defined in claim 1, wherein a sectional area has a rectangular configuration and the laser pulse has a rectangular configuration.

12. A method as defined in claim 1, further comprising the step of doping the semiconductor thin film with impurities before said irradiation step.

13. A method as defined in claim 1, wherein the semiconductor thin film formed on the insulating wafer surface comprises amorphous or polycrystal silicon.

14. A method as defined in claim 1, wherein in said irradiation step an eximer laser pulse is employed having a wavelength of 300 nm to 350 nm, an energy density of about 200 mJ/cm$^2$ to about 400 mJ/cm$^2$, a pulse time of 40 nanoseconds or more and a laser absorption depth of about 160 nm.

* * * * *